US009438271B2

(12) United States Patent
Itani et al.

(10) Patent No.: US 9,438,271 B2
(45) Date of Patent: Sep. 6, 2016

(54) DATA COMPRESSION APPARATUS AND METHOD

(71) Applicant: FUJITSU LIMITED, Kawasaki-shi, Kanagawa (JP)

(72) Inventors: Noriko Itani, Hadano (JP); Takumi Maruyama, Yokohama (JP); Ryuji Kan, Yokohama (JP); Shigeki Itou, Kawasaki (JP); Yasuhiko Nakano, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/053,022

(22) Filed: Feb. 25, 2016

(65) Prior Publication Data

US 2016/0173127 A1  Jun. 16, 2016

Related U.S. Application Data

(63) Continuation of application No. PCT/JP2013/073353, filed on Aug. 30, 2013.

(51) Int. Cl.
*H03M 7/30* (2006.01)

(52) U.S. Cl.
CPC ......... *H03M 7/6011* (2013.01); *H03M 7/3086* (2013.01)

(58) Field of Classification Search
CPC .. H03M 7/60; H03M 7/3084; H03M 7/3086; H03M 7/3088; H03M 7/6011; H03M 7/30
USPC ...................................................... 341/51, 87
See application file for complete search history.

(56) References Cited

U.S. PATENT DOCUMENTS

| 5,652,878 A | 7/1997 | Craft | |
|---|---|---|---|
| 6,563,956 B1 * | 5/2003 | Satoh | H03M 7/3084 341/51 |
| 7,215,259 B2 * | 5/2007 | Kerber | H03M 7/3084 341/106 |

(Continued)

FOREIGN PATENT DOCUMENTS

| JP | 5-233212 | 9/1993 |
|---|---|---|
| JP | 5-241776 | 9/1993 |

(Continued)

OTHER PUBLICATIONS

Fiala et al., "Data Compression with Finite Windows", Communications of the ACM, Apr. 1989, vol. 32 No. 4, pp. 490-505 (16 pages).

(Continued)

*Primary Examiner* — Khai M Nguyen
(74) *Attorney, Agent, or Firm* — Fujitsu Patent Center

(57) ABSTRACT

A data compression apparatus includes a memory and a processor. The processor extracts a second character string as a matching string from a character string after a first character string in a character string of data before compression that is stored in the memory, the second character string being identical with the first character string, and identifies a length of the matching string, and a relative position indicating how many addresses the first character string precedes the second character string by. The processor extracts a third character string having a length that is less than the relative position from the extracted second character string. The processor encodes a length of the third character string. The processor encodes the relative position.

8 Claims, 22 Drawing Sheets

(56) References Cited

U.S. PATENT DOCUMENTS

2006/0267806 A1   11/2006  Hirose
2012/0130965 A1*  5/2012   Oh ..................... H03M 7/3088
                                                      707/693

FOREIGN PATENT DOCUMENTS

JP    2000-188692    7/2000
JP    2003-264703    9/2003
JP    2006-332982   12/2006

OTHER PUBLICATIONS

International Search Report, mailed in connection with PCT/JP2013/073353 and mailed Oct. 22, 2013 (2 pages).
Khalid Sayood: "Introduction to data compression", 1996, Morgan Kaufmann, XP002759445, pp. 100-105.
Wikipedia: "LZ77 and LZ78", Internet article, Jun. 26, 2013, XP002759446, Retrieved from the Internet: URL:https://en,wikipedia.org/w/index/php?title=LZ77 and LZ78 &oldid=561638336 [retrieved on Jul. 4, 2016].
EESR—The Extended European Seach Report dated Jul. 19, 2016 for corresponding European Patent Application No. 13892176.2.

* cited by examiner

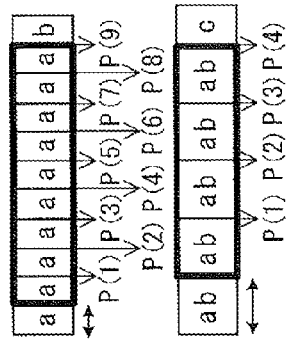
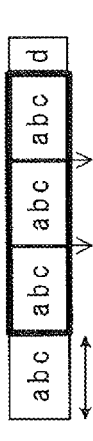
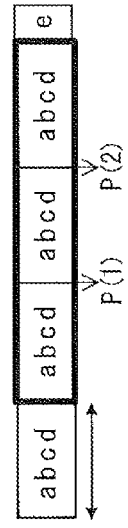
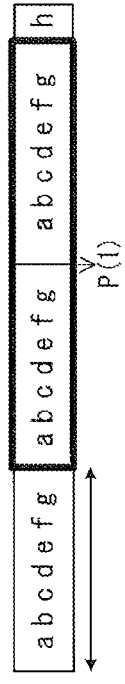
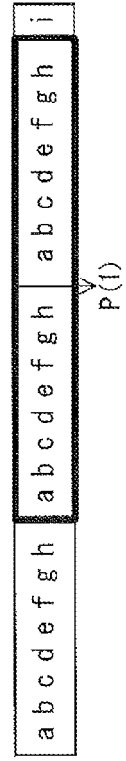
F I G. 4

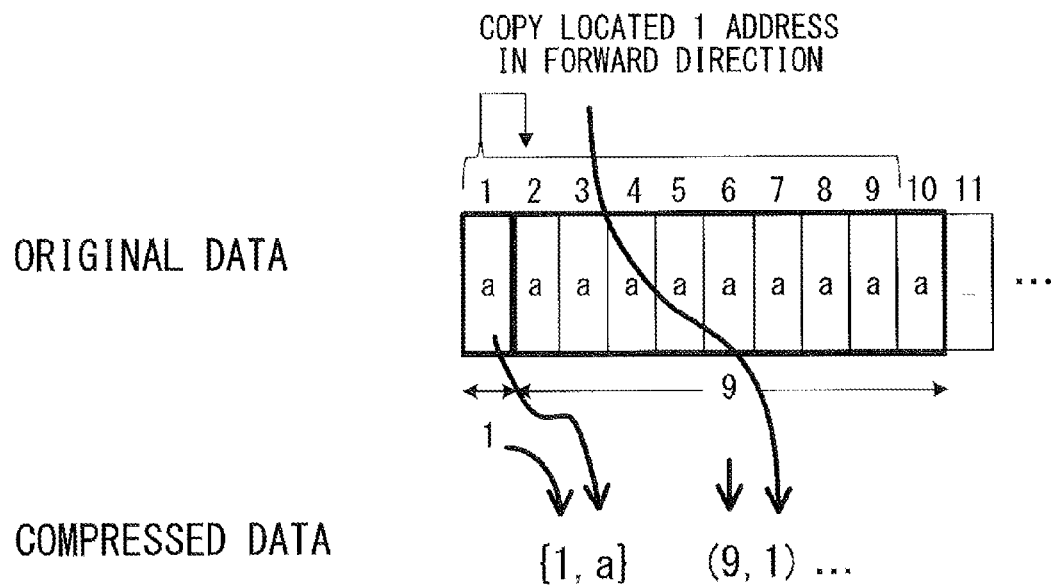
F I G. 6 A

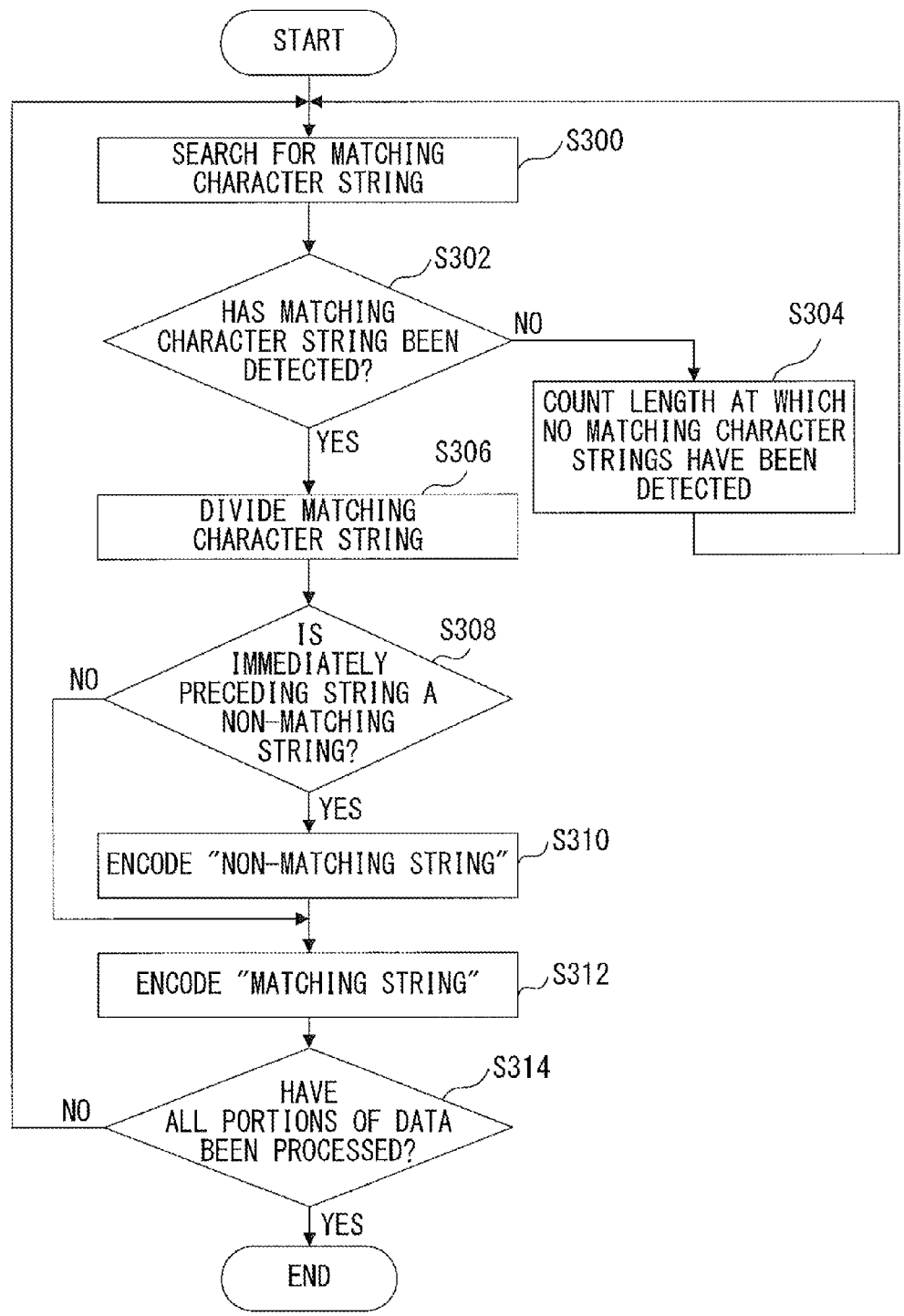
F I G. 8

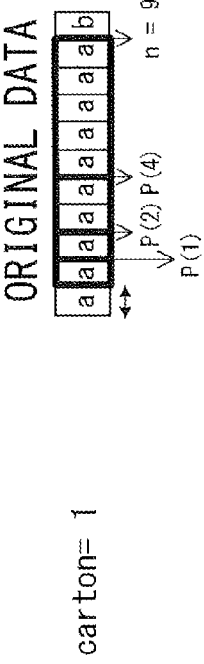
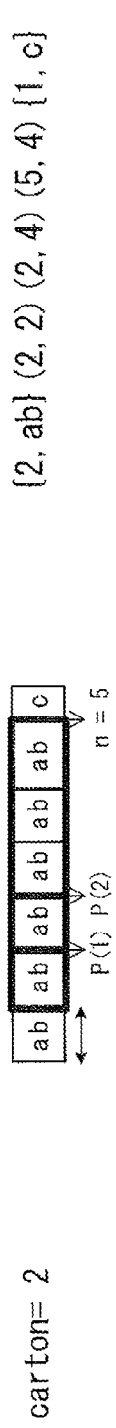
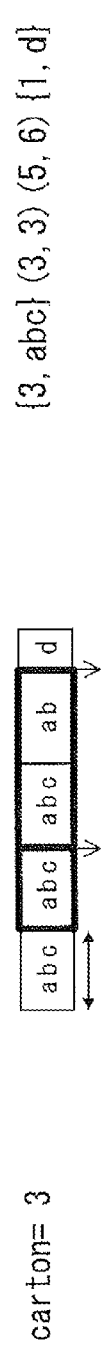
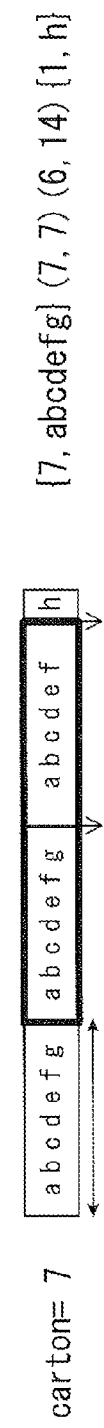
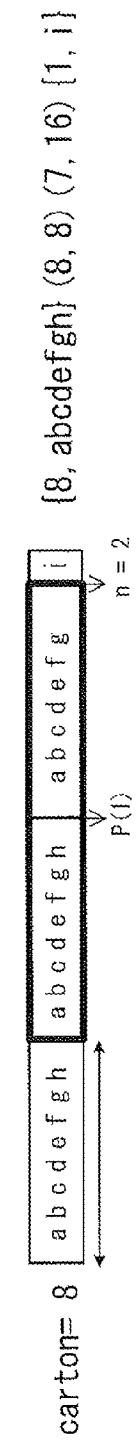
FIG. 15

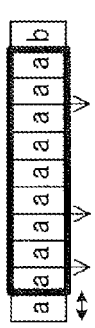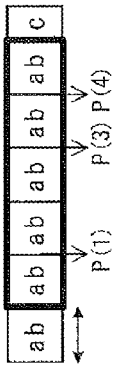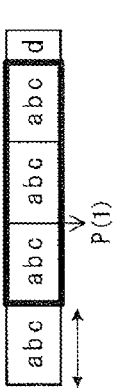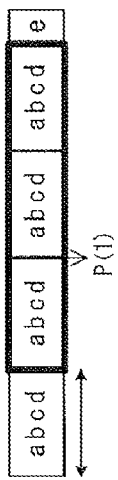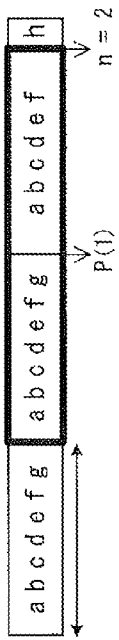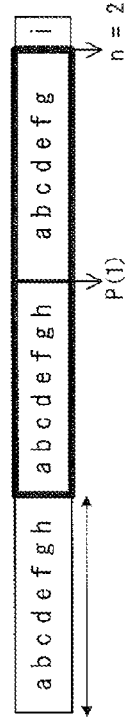
FIG. 16

ORIGINAL DATA COMPRESSED DATA OF PRESENT INVENTION
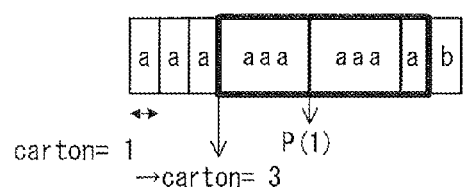
{3, aaa} (3, 3) (4, 6) {1, b}
carton= 1
→carton= 3
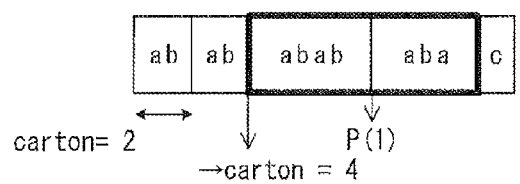
{4, abab} (4, 4) (3, 8) {1, c}
carton= 2
→carton = 4
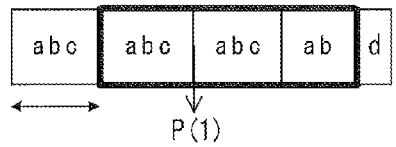
{3, abc} (3, 3) (5, 6) {1, d}
NO ADJUSTMENT BECAUSE carton = 3 > N
F I G. 1 7

DATA COMPRESSION APPARATUS AND METHOD

CROSS-REFERENCE TO RELATED APPLICATION

This application is a continuation application of International Application PCT/JP2013/073353 filed on Aug. 30, 2013 and designated the U.S., the entire contents of which are incorporated herein by reference.

The embodiments discussed herein are related to a data compression apparatus and a method.

BACKGROUND

As a data compression algorithm, the LZ77 algorithm published by Abraham Lempel and Jacob Ziv in 1977 is known. The LZ77 algorithm is one example of a dictionary compression scheme, and is also referred to as a sliding dictionary scheme. In the LZ77 algorithm, data is encoded in order from the head. In the sliding dictionary scheme, a search is performed to determine whether a symbol string starting at a position of interest has previously appeared. When the symbol string has previously appeared, the symbol string is replaced with a pointer representing the appearance position and the length of the symbol string. The term "sliding dictionary scheme" originates from the fact that a range in which a symbol string is searched for is referred to as a "sliding window" and that the sliding window is used for a dictionary.

In the LZ77 algorithm, a data amount is reduced by replacing a repeatedly appearing data string with the length and the appearance position of a symbol string that has previously appeared. In decompression, original data can be decompressed by copying a symbol string having a matching length from a position where the symbol string has previously appeared and having a matching length. In addition, the LZ77 algorithm shows a method for encoding a length at which no repetition is detected and a symbol string that does not include any repetition when no repetition is detected.

Depending on an operating system (OS) of a Central Processing Unit (CPU), a Single Instruction Multiple Data (SIMD) instruction whereby plural pieces of data are handled when a single instruction is issued has been prepared, and data can be copied between memories in 16-byte or 32-byte units at high speed. When the SIMD instruction is used in copying processing in decompression, speeding-up of decompression can be realized.

[Non-Patent Document 1] Fiala, E. and Greene, D. (1989) "Data compression with finite windows" Communications of the ACM, 32(4) pp. 490-505

SUMMARY

According to an aspect of the embodiments, a data compression apparatus includes a processor. The processor extracts a second character string as a matching string from a character string after a first character string in a character string of data before compression, the second character string being identical with the first character string, and identifies a length of the matching string, and a relative position indicating how many addresses the first character string precedes the second character string by. The processor extracts a third character string having a length that is less than the relative position from the extracted second character string. The processor encodes a length of the third character string. The processor encodes the relative position.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 4 illustrates examples of original data and compressed data in a comparative example.

FIG. 6A illustrates an example of a compression process performed by a data compression apparatus in a comparative example.

FIG. 8 illustrates an example of a flow of a compression process performed by a data compression apparatus according to the embodiments.

FIG. 15 illustrates an example of division at $P(n \div 2)$, $P(n \div 4), \ldots,$ and $P(n \div 2^m)$.

FIG. 16 illustrates another example of division at $P(1)$, $P(3), \ldots,$ and $P(2^m-1)$.

FIG. 17 illustrates yet another example of division at $P(1)$, $P(3), \ldots,$ and $P(2^m-1)$.

DESCRIPTION OF EMBODIMENTS

Figure 1:
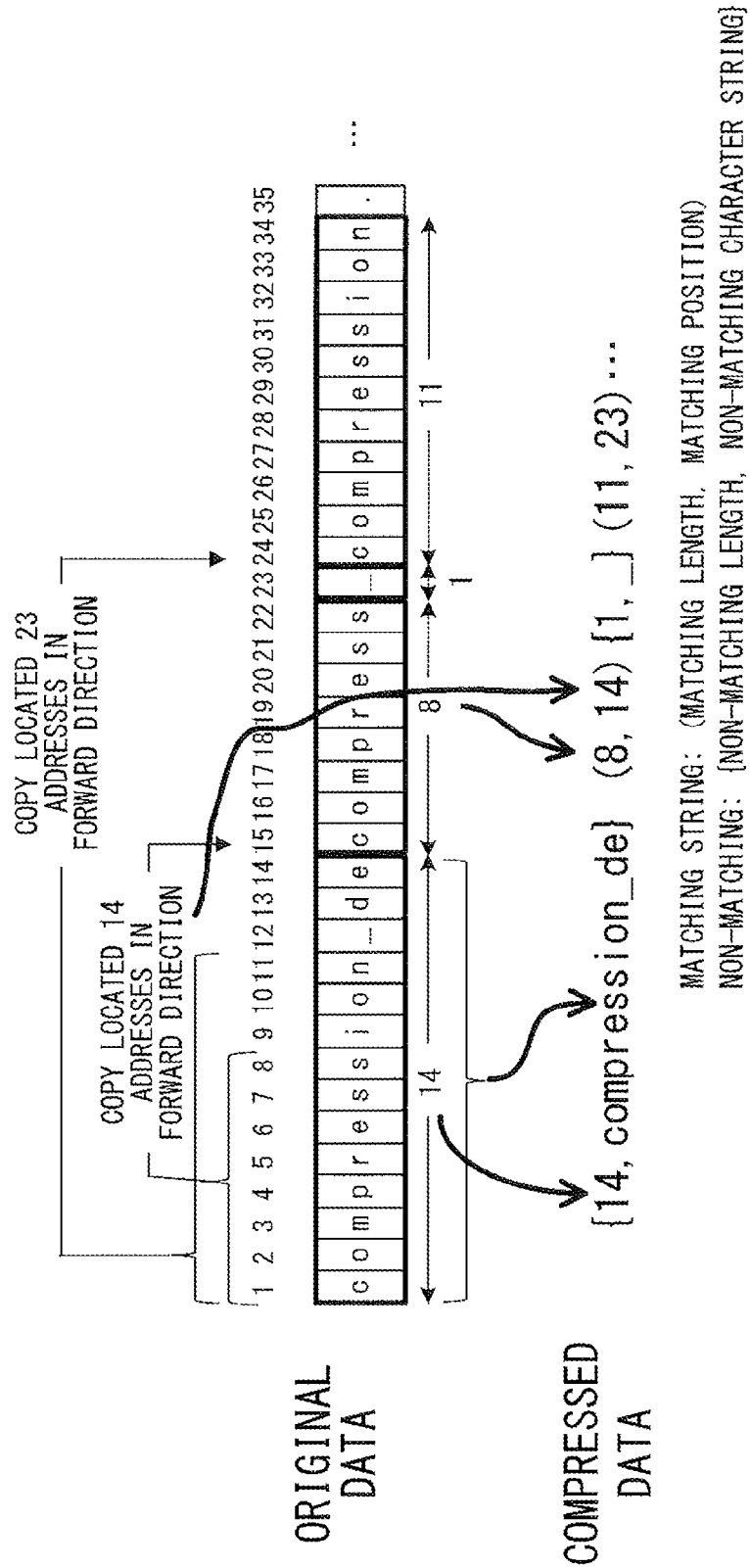
FIG. 1 is a diagram explaining an outline of the LZ77 algorithm.

In the LZ77 algorithm, the last address of a copy source character string may be located in a backward direction of the first address of a copy destination character string. Hereinafter, this is simply referred to as "a copy source overlaps a copy destination". As an example, in a case in which the same character is repeated so as to generate the character string "aaaa . . . ", the addresses of a copy source character string are "1, 2, 3, 4 . . . ", and the addresses of a copy destination character string are "2, 3, 4, ... ". Namely, the copy source character string overlaps the copy destination character string at addresses "2, 3, 4, ... ". In such a case, when decompression is performed, a previously appearing character string is copied in a procedure of copying the first byte into the second byte in step 1, and copying the second byte into the third byte in step 2. In this case, the process of step 2 is not performed until the process of step 1 is completed. Stated another way, in the LZ77 algorithm, a data string can be decompressed by performing simple copying because a repeatedly appearing data string is replaced with the length and the appearance position of a data string that has previously appeared; however, when a copy source overlaps a copy destination, copying each individual byte may need to be performed. Consequently, there is a problem in that whether a copy source overlaps a copy destination needs to be confirmed first in order to use high-speed multi-byte copying in decompression, and when the copy source overlaps the copy destination, a complicated process for copying each individual byte is needed.

A comparative example is described first, and embodiments are described next, with reference to the drawings.

A data compression apparatus, a method, and a program using the LZ77 algorithm are described below, but a data compression scheme is not limited to the LZ77 algorithm, and any compression scheme can be employed that reduces a data amount by replacing a repeatedly appearing data string with the length and the appearance position of a data string that has previously appeared.

In the LZ77 algorithm, a repeatedly appearing character string is searched for, and when the character string appears a second time or later, the character string is compressed by replacing the character string with data relating to an appearance position and a length. The appearance position is a difference in an address between the head positions of a character string when the character string appears for a plurality of times and when the character string has previously appeared, in a case in which the character string appears a plurality of times.

The following notation rules are used in the description below.
(Rule 1) A matching string is represented by (matching length, starting position of matching string).
(Rule 2) A non-matching string is represented by {non-matching length, non-matching character string}.
The starting position of a matching string represents how many addresses a character string that is identical with the matching string precedes the matching string by. The starting position of the matching string is also referred to as a "matching position" or a "relative position". The starting position of the matching string (the relative position) may be a difference in an address between the head positions of a character string when the character string appears for a plurality of times and when the character string has previously appeared, in a case in which the character string appears a plurality of times, namely, the length of a relative distance. As an example, the starting position of a matching string being "14" may mean that a head position when the character string appears for a plurality of times is located 14 addresses in a backward direction from a head position when the character string has previously appeared. The expression "encode a matching string in a character string of original data into compressed data in the form of (matching length, starting position of matching string)" is also used. Similarly, the expression "encode a non-matching string in a character string of original data into compressed data in the form of {non-matching length, non-matching character string}" is also used.

COMPARATIVE EXAMPLE

A comparative example is described below with reference to FIGS. 1 to 6B. The description below of the comparative example is also a description of an outline of the LZ77 algorithm.

FIG. 1 is a diagram explaining an outline of the LZ77 algorithm.

As an example, in data before compression (hereinafter also referred to simply as "original data") that is stored at the 1st to 34th addresses illustrated in FIG. 1, the character string "compression_de" is stored at the 1st to 14th addresses, the character string "compress" is stored at the 15th to 22nd addresses, "_" (underbar) is stored at the 23rd address, and the character string "compression" is stored at the 24th to 34th addresses. "compression_de" stored at the 1st to 14th addresses is a non-matching string, and has a non-matching length of 14, and therefore "compression_de" is represented as "{14, compression_de}" in compressed data. "compress" stored at the 15th to 22nd addresses of the original data is identical with a character string at the 1st to 8th addresses. "compress" is formed of 8 characters. The identical character string precedes "compress" by 14 addresses, and therefore the starting position of the matching string is 14. Accordingly, data at the 15th to 22nd addresses of the original data is encoded into "(8, 14)" in the compressed data. "_" (underbar) stored at the 23rd address of the original data has not appeared previously, and therefore "_" (underbar) is encoded into "{1, _}" in the compressed data. "compression" stored at the 24th to 34th addresses of the original data is identical with the character string stored at the 1st to 8th addresses, and "compress" is formed of 8 characters. The identical character string precedes "compress" by 23 addresses, and therefore the starting position of the matching string is 23. Accordingly, data at the 24th to 34th addresses of the original data is encoded into "(11, 23)" in the compressed data.

As described above, the character string of the original data illustrated in FIG. 1 is represented as "{14, compression_de} (8, 14){1, _} (11, 23)" in the compressed data.

Figure 2:
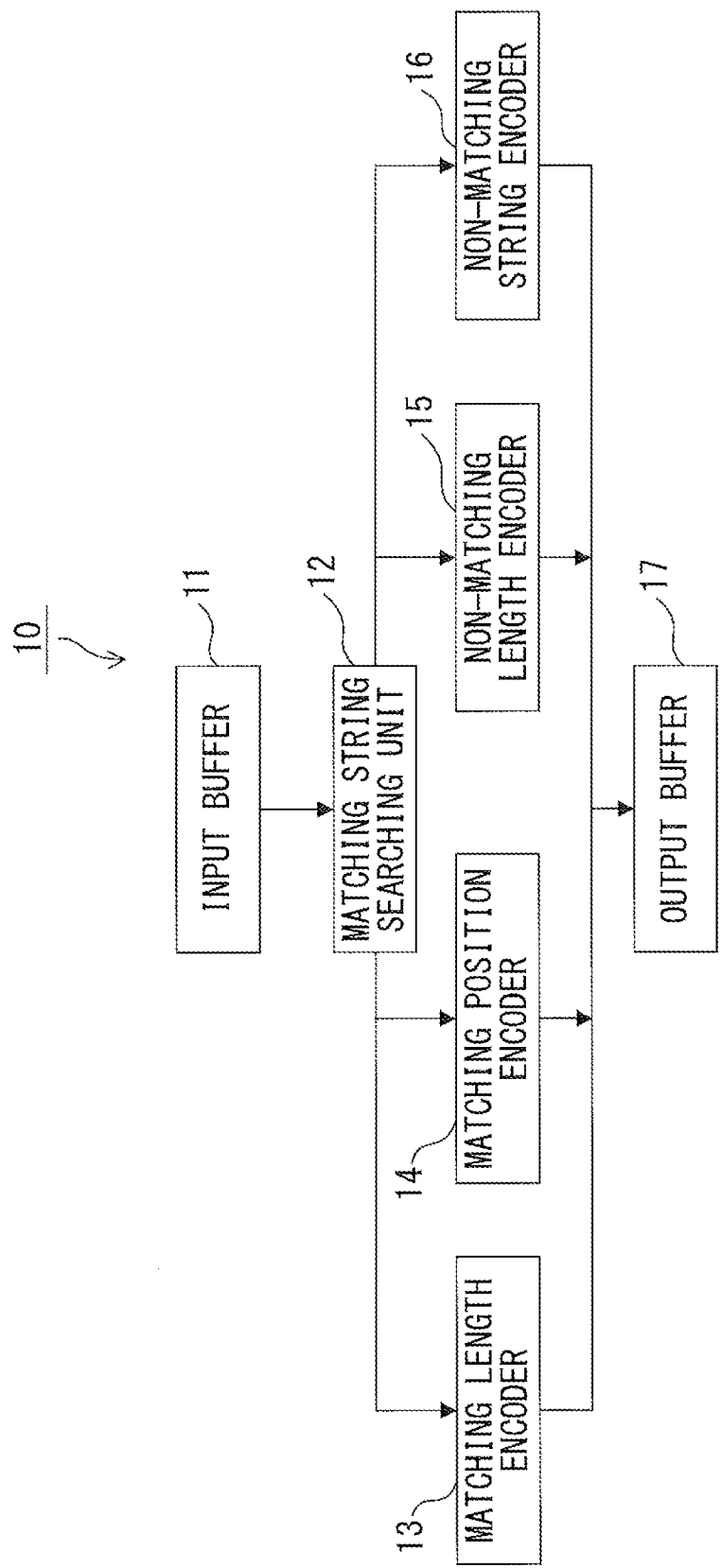
FIG. 2 is an exemplary functional block diagram of a data compression apparatus in a comparative example.

FIG. 2 is an exemplary functional block diagram of a compression apparatus that compresses original data by using the LZ77 algorithm so as to generate compressed data.

A compression apparatus 10 includes an input buffer 11, a matching string searching unit 12, a matching length encoder 13, a matching position encoder 14, a non-matching length encoder 15, a non-matching string encoder 16, and an output buffer 17.

The input buffer 11 receives data before compression (original data) as stored at the 1st to 34th addresses illustrated in FIG. 1 from outside, and temporarily stores the data as needed. In the example illustrated in FIG. 1, the original data is "compression_decompression compression.".

The matching string searching unit 12 searches whether a repeatedly appearing character string (a matching string) is included in a character string of the original data stored in the input buffer 11, and extracts a repeatedly appearing character string (matching string). When a matching string is included, the matching string searching unit 12 identifies the matching string. In the example illustrated in FIG. 1, for example, the character strings "compress" and "compression" appear a plurality of times, and therefore these character strings are matching strings.

The matching length encoder 13 extracts the length of the matching string searched for and extracted by the matching string searching unit 12, and identifies the first element of (matching length, starting position of matching string) representing the matching string, according to Rule 1. In the example illustrated in FIG. 1, for example, the character string "compress" stored at the 15th to 22nd addresses of the original data is identical with a character string stored at the 1st to 8th addresses, and is formed of 8 characters. Accordingly, the matching length is encoded into "8".

The matching position encoder 14 detects how many addresses a character string identical with the matching string that has been searched for and extracted by the matching string searching unit 12 precedes the matching string by, and identifies the second element of (matching length, starting position of matching string) representing the matching string, according to Rule 1. In the example illustrated in FIG. 1, for example, the character string "compress" stored at the 15th to 22nd addresses of the original data is identical with the character string stored at the 1st to 8th addresses, and the identical character string precedes the character string "compress" by 14 addresses. Accordingly, the starting position of the matching string is encoded into "14" by the matching length encoder 13.

The non-matching length encoder 15 extracts the length of a non-matching string that has not been extracted as a matching string by the matching string searching unit 12, and identifies the first element of {non-matching length, non-matching character string} representing the non-matching string, according to Rule 2. In the example illustrated in FIG. 1, for example, "compression_de" stored at the 1st to 14th addresses is a non-matching string, and is formed of 14 characters. Therefore, the non-matching length is encoded into "14" by the non-matching length encoder 15.

The non-matching string encoder 16 extracts the non-matching string that has not been extracted as a matching string by the matching string searching unit 12, and identifies the second element of {non-matching length, non-matching character string} representing the non-matching string, according to Rule 2. In the example illustrated in FIG. 1, for example, "compression_de" stored in the positions having the 1st to 14th addresses is a non-matching string. Therefore, the non-matching character string is encoded into "compression_de" by the non-matching length encoder 15.

The output buffer 17 encodes original data by using the results of the matching length encoder 13, the matching position encoder 14, the non-matching length encoder 15, and the non-matching string encoder 16 so as to generate compressed data that is a result of compression, and temporarily stores the compressed data as needed. In the example illustrated in FIG. 1, for example, the character string "compression_decompression compression.", which is the original data, is encoded into "{14, compression_de} (8, 14){1, _}(11, 23)".

Figure 3:
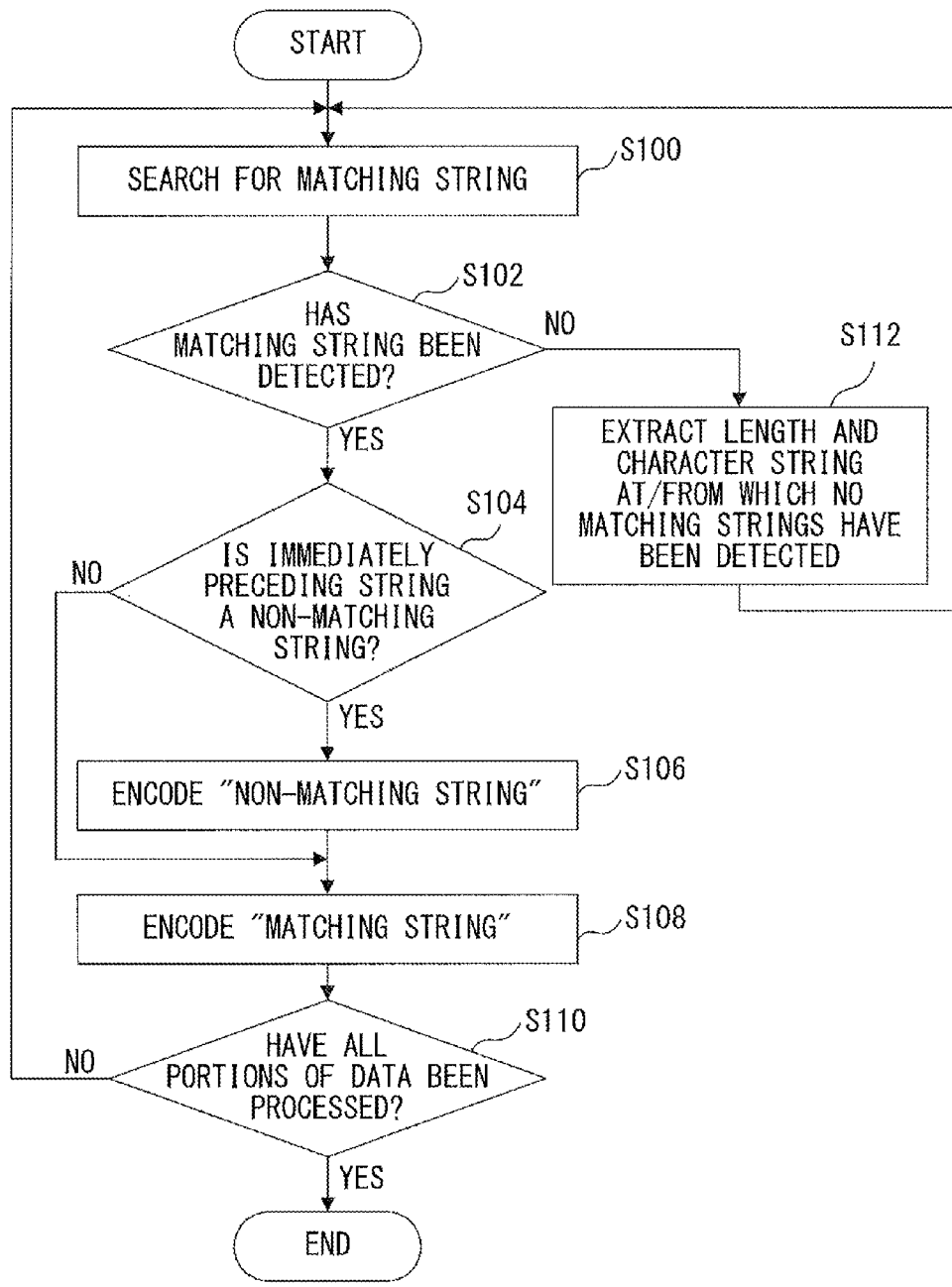
FIG. 3 illustrates a flow of a compression process performed by a data compression apparatus in a comparative example.

FIG. 3 illustrates an example of a flow of a compression process performed by a data compression apparatus in the comparative example.

When processing is initiated, the matching string searching unit 12 searches whether a matching string that is a repeatedly appearing character string is included in a character string of original data in S100. When the process of this step is finished, the process moves on to S102. The character string of the original data may be a character string stored in the input buffer 11.

In S102, the matching string searching unit 12 determines whether a matching string has been detected. When the determination result is "YES", namely, when a matching string has been detected, the process moves on to S104. When the determination result is "NO", namely, when a matching string has not been detected, the process moves on to S112.

In S104, the matching string searching unit 12 determines whether a character string stored immediately before the address of the first character of the matching string detected in S102 is a non-matching string. When the determination result is "YES", namely, when the immediately preceding character string is a non-matching string, the process moves on to S106. When the determination result is "NO", namely, when the immediately preceding character string is not a non-matching string, the process moves on to S108.

In S106, the non-matching length encoder 15 and the non-matching string encoder 16 encode the non-matching string that immediately precedes the matching string detected in S102. An example of encoding is illustrated in FIG. 1. When the process of this step is finished, the process moves on to S108.

In S108, the matching length encoder 13 and the matching position encoder 14 encode the matching string detected in S102. An example of encoding is illustrated in FIG. 1. When the process of this step is finished, the process moves on to S110.

In S110, the output buffer 17 determines whether all portions of the original data to be compressed have been processed. When the determination result is "YES", namely, when all portions of the original data have been processed, the compression process is finished. When the determination result is "NO", namely, when not all portions of the original data have been processed, the process returns to S100.

When no matching strings have been detected in S102, the process moves on to S112.

In S112, the non-matching length encoder 15 and the non-matching string encoder 16 respectively extract the length and the character string of the non-matching string from which no matching strings have been detected. Information relating to the length of the non-matching string and information relating to the character string of the non-matching string are temporarily stored in the non-matching length encoder 15 and the non-matching string encoder 16, respectively. These pieces of information are used in S106. When the process of this step is finished, the process returns to S100.

FIG. 4 illustrates examples of original data and compressed data in the comparative example.

FIG. 4 illustrates a case in which original data is a recurring character string. The length of a recurring character string is referred to as a "carton". Rules 1 and 2 described above are also used in FIG. 6.

In FIG. 4, P(n) (where n is an integer) represents a break between cartons.

As an example of a case where carton=1, FIG. 4 illustrates a case where original data is "aaaaaaaaaab".

In this case, "a" at the first address is a non-matching string, and "aaaaaaaaa" at the 2nd to 10th addresses is a matching string.

In a case where original data is "aaaaaaaaaab", the obtained compressed data is "{1, a}, (9, 1), {1, b}". The second element "1" of "(9, 1)" representing the matching string in the compressed data corresponds to the carton.

As an example of a case where carton=2, FIG. 4 illustrates a case where original data is "ababababbc". In this case, "ab" at the 1st and 2nd addresses is a non-matching string, and "abababab" at the 3rd to 10th addresses is a matching string. The character "c" at the 11th address is a non-matching string. The length of a recurring character string is 2, and therefore the 2nd to 10th addresses are divided in 2-character units, and the original data is divided at positions after the 4th and the 6th addresses in such a way that the positions become P(1) and P(2), respectively.

In a case where original data is "ababababc", the obtained compressed data is "{2, ab}, (10, 2), {1, c}".

As an example of a case where carton=3, FIG. 4 illustrates a case where original data is "abcabcabcabcd". In this case, "abc" at the 1st to 3rd addresses is a non-matching string, and "abcabcabc" at the 4th to 12th addresses is a matching string. The character "d" at the 13th address is a non-matching string.

In a case where original data is "abcabcabcabcd", the obtained compressed data is "{3, abc}, (9, 3), {1, d}".

As an example of a case where carton=4, FIG. 4 illustrates a case where original data is "abcdabcdabcdabcde". In this case, "abcd" at the 1st to 4th addresses is a non-matching string, and "abcdabcdabcd" at the 5th to 16th addresses is a matching string. The character "e" at the 17th address is a non-matching string.

In a case where original data is "abcdabcdabcdabcde", the obtained compressed data is "{4, abcd}, (12, 4), {1, e}".

As an example of a case where carton=7, FIG. 4 illustrates a case where original data is "abcdefgabcdefgabcdefgh". In this case, "abcdefg" at the 1st to 7th addresses is a non-matching string, and "abcdefgabcdefg" at the 8th to 21st addresses is a matching string. The character "h" at the 22nd address is a non-matching string.

In a case where original data is "abcdefgabcdefgabcdefgh", the obtained compressed data is "{7, abcdefg}, (14, 7), {1, h}".

As an example of a case where carton=8, FIG. 4 illustrates a case where original data is "abcdefghabcdefghabcdefghi". In this case, "abcdefgh" at the 1st to 8th addresses is a non-matching string, and "abcdefghabcdefgh" at the 9th to 24th addresses is a matching string. The character "i" at the 25th address is a non-matching string.

In a case where original data is "abcdefghabcdefghabcdefghi", the obtained compressed data is "{8, abcdefgh}, (16, 8), {1, i}".

A process of decompressing data that has been compressed as a result of a process as illustrated in FIG. 3 is now described with reference to FIG. 5.

Figure 5:
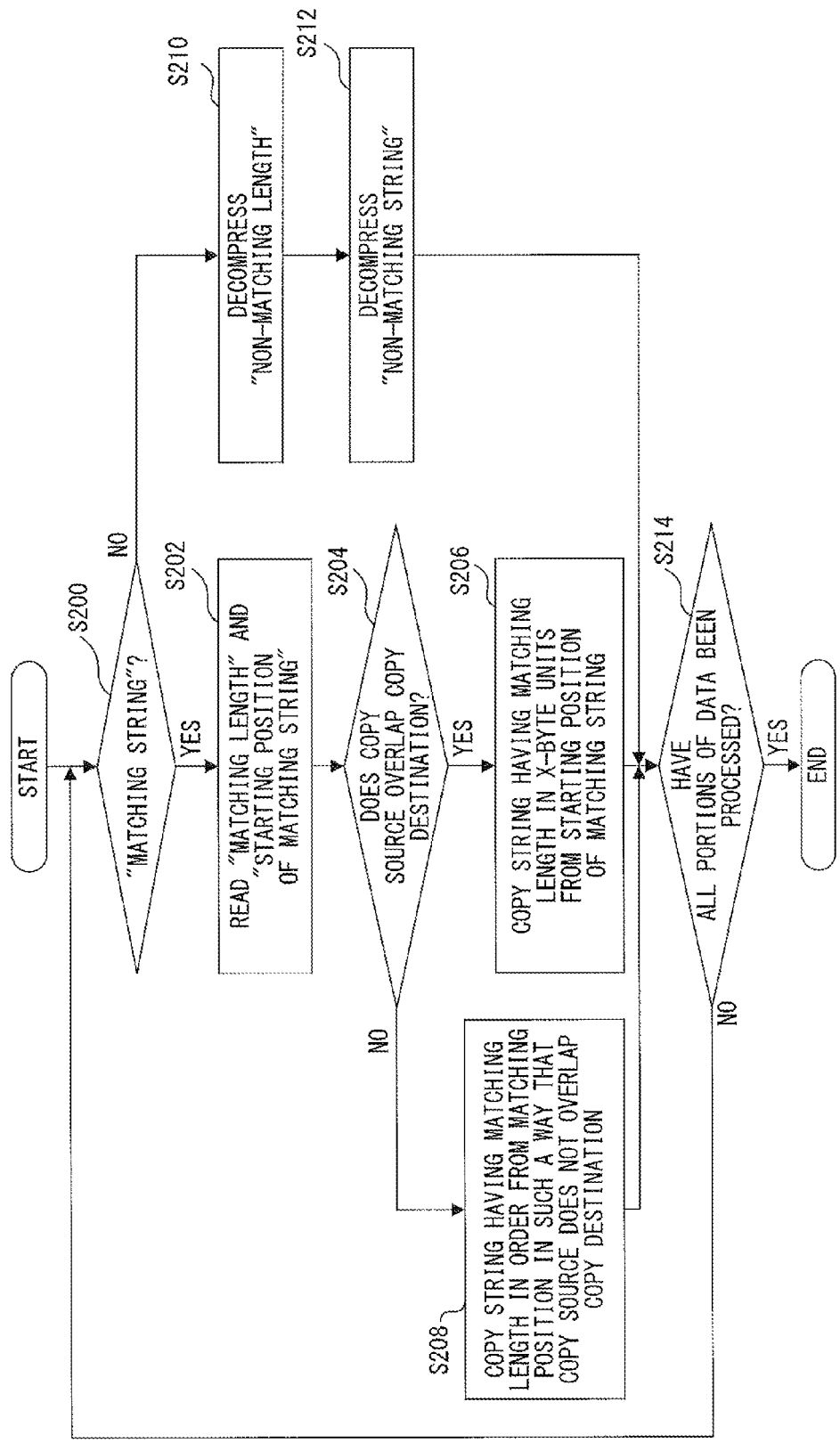
FIG. 5 illustrates an example of a flow of a decompression process in a comparative example.
Figure 18:
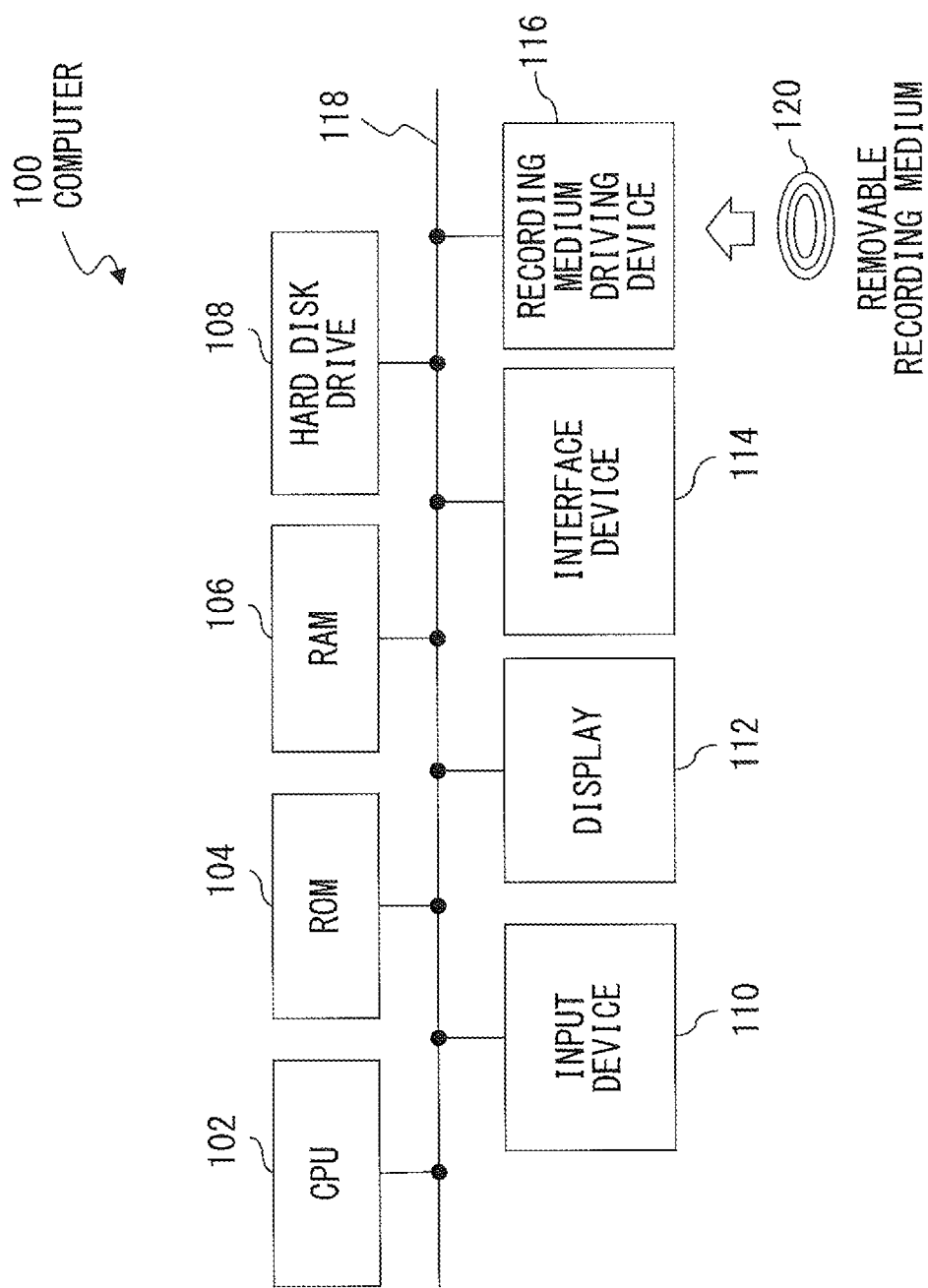
FIG. 18 illustrates an example of a configuration of a computer.

The process illustrated in FIG. 5 may be performed by a computer having the configuration illustrated in FIG. 18. A computer 100 illustrated in FIG. 18 includes a Central Processing Unit (CPU) 102, a memory, a Read Only Memory (ROM) 104, and a Random Access Memory (RAM) 106.

Assume that compressed data has been stored in the RAM 106 before processing is initiated. The decompression process is performed in units of a string in the compressed data. In the example illustrated in FIG. 1, for example, the compressed data "{14, compression_de}(8, 14){1,}(11, 23)" is sequentially decompressed in units of a portion in brackets.

When processing is initiated, the CPU 102 determines whether data being currently processed is a matching data in S200. When the determination result is "YES", namely, when the data being currently processed is a matching string, the process moves on to S202. When the determination result is "NO", namely, when the data being currently processed is not a matching data, the process moves on to S210.

In S202, the CPU 102 reads a matching length and the starting position of the matching string from compressed data of the matching string. When the process of this step is finished, the process moves on to S204.

In S204, the CPU 102 determines whether a copy source overlaps a copy destination.

An example in which a copy source overlaps a copy destination is now described with reference to FIGS. 6A and 6B.

As illustrated in FIG. 6A, assume that a character string of original data is a character string beginning with a character string in which the character "a" is arranged ten times, "aaaaaaaaaa". This character string of the original data is compressed according to Rules 1 and 2 described above, as described below.

The character string "aaa" at the 1st address is a non-matching string because no characters exist before this character string. Accordingly, "{1, a}" is extracted as a provisional non-matching string.

In a process of the character string "aaaaaaaaa" at the 2nd to 9th addresses, this character string is identical with the character string "aaaaaaaaa" at the 1st address, and therefore this character string is determined to be a matching string (see S102 of FIG. 3). It is further determined whether a provisional non-matching string has been stored (see S104 of FIG. 3). Because the provisional non-matching string has been stored, the non-matching string {1, a} is encoded (S106). In addition, the character string "aaaaaaaaa" at the 2nd to 9th addresses is encoded. According to Rule 1 described above, the matching string is represented as (matching length, starting position of matching string). In this case, the matching length is "9", which is the number of addresses from the 2nd address to the 9th address. The starting position of the matching string is located at the 1st address, which is an address that precedes the 2nd address by one, and therefore the starting position of the matching string is "1". Accordingly, the original data is encoded into "{1, a}(9, 1)", as illustrated in FIG. 6A. Consequently, the obtained compressed data is "{1, a}(9, 1)".

Figure 6B:
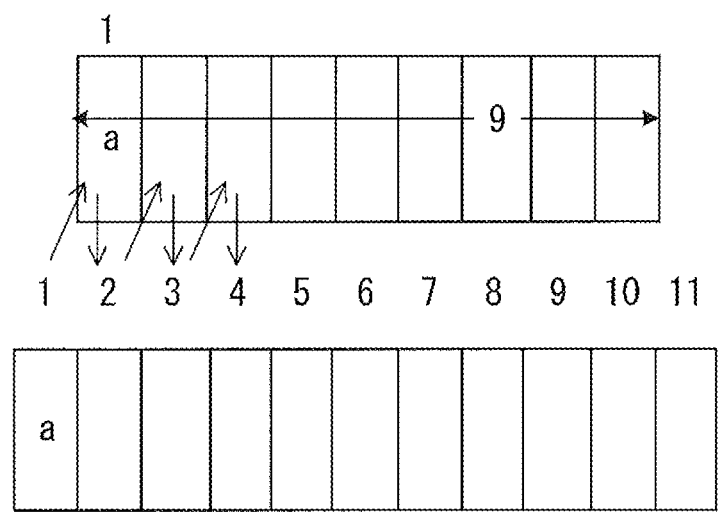
FIG. 6B illustrates an example of a decompression process in a comparative example.

FIG. 6B is a diagram explaining an outline of a process of decompressing the compressed data "{1, a}(9, 1)".

In the decompression of the compressed data "{1, a}(9, 1)", the portion "{1, a}" is first decompressed. As a result, the character "a" is stored at the 1st address.

In the decompression of the next portion "(9, 1)", an operation of copying a character stored at an address that precedes each address to a position having each of the addresses is performed. Namely, decompression at the 3rd address includes an operation of storing a character stored at the 2nd address in a position having the 3rd address. Stated another way, before decompression is performed at the 3rd address, there is a wait for an operation of copying a character stored at the 1st address to a position having the 2nd address to be finished.

In the example illustrated in FIG. 1, when the portion "(8, 14)" in the compressed data is decompressed, 8 characters beginning with a character that precedes a matching string represented as "(8, 14)" by 14 addresses are copied to positions having the 15th to 22nd addresses. In this case, a copy source does not overlap a copy destination.

As described above, in S204, the CPU 102 determines whether a copy source overlaps a copy destination in the decompression process, as illustrated in FIG. 5B, for example. When the determination result is "YES", namely, when the copy source overlaps the copy destination, the process moves on to S206. When the determination result is "NO", namely, when the copy source does not overlap the copy destination, the process moves on to S208.

In S206, the CPU 102 copies characters having the matching length from the starting position of the matching string. When the process of this step is finished, the process moves on to S214.

In S208, the CPU 102 copies characters having the matching length in order from the starting position of the matching string in such a way that the copy source does not overlap the copy destination. In the example illustrated in FIG. 6B, one character "a" is copied from the starting position of the matching string.

When it is determined in S200 that the data being currently processed is not a matching string, the process moves on to S210.

In S210, the CPU 102 reads and decompresses a non-matching length from compressed data of a non-matching string according to Rule 2. When the process of this step is finished, the process moves on to S212.

In S212, the CPU 102 reads and decompresses a non-matching character string from the compressed data of the non-matching string according to Rule 2.

As an example, the non-matching length "14" and the non-matching character string "compression_de" can be read from the portion "{14, compression_de}" in the compressed data "{14, compression_de}(8, 14){1, _}(11,23)". Then, "compression_de" is stored at the 1st to 14th addresses. When the process of this step is finished, the process moves on to S214.

In S214, the CPU 102 determines whether all portions of the original data to be decompressed have been processed. When the determination result is "YES", namely, when all portions of the compressed data have been processed, the decompression process is finished. When the determination result is "NO", namely when not all portions of the compressed data have been processed, the process returns to S200.

As described above, in the comparative example, a copy source may overlap a copy destination, as illustrated in FIG. 6B, for example. In the example illustrated in FIG. 6B, copying is performed in the procedure of <step 1: copy the first byte to the second byte> and <step 2: copy the second byte to the third byte>. Before the process of step 1 is finished, the process of step 2 is not performed, and copying is performed in units of a length less than or equal to a carton, for example, in one-byte units. As described above, in order to employ high-speed multi-byte copying in decompression, it is confirmed whether a copy source overlaps a copy destination. When the copy source overlaps the copy destination, a complicated process for performing copying in units of a length less than or equal to a carton, for example, in one-byte units, is needed.

EMBODIMENTS

In the embodiments descried below, in the LZ77 algorithm, a matching string is divided and encoded in such away that a relative position is greater than a matching length, namely, offset>length, where offset represents a relative position, and length represents a matching length. By performing compression as described above, the matching string is divided in such a way that a copy source does not overlap a copy destination, and consequently compressed data can be generated that enables high-speed decompression without performing conditional branch processing in decompression. Stated another way, in order to realize the decompression of compressed data in multi-byte units, a matching string repeatedly appearing in original data is subdivided and compressed in such a way that a copy source does not overlap a copy destination in decompression, and as a result compressed data that can be decompressed at high speed can be generated.

The term "overlap" may mean that the last address of a copy source character string is located in a backward direction from the first address of a copy destination character string.

Figure 7:
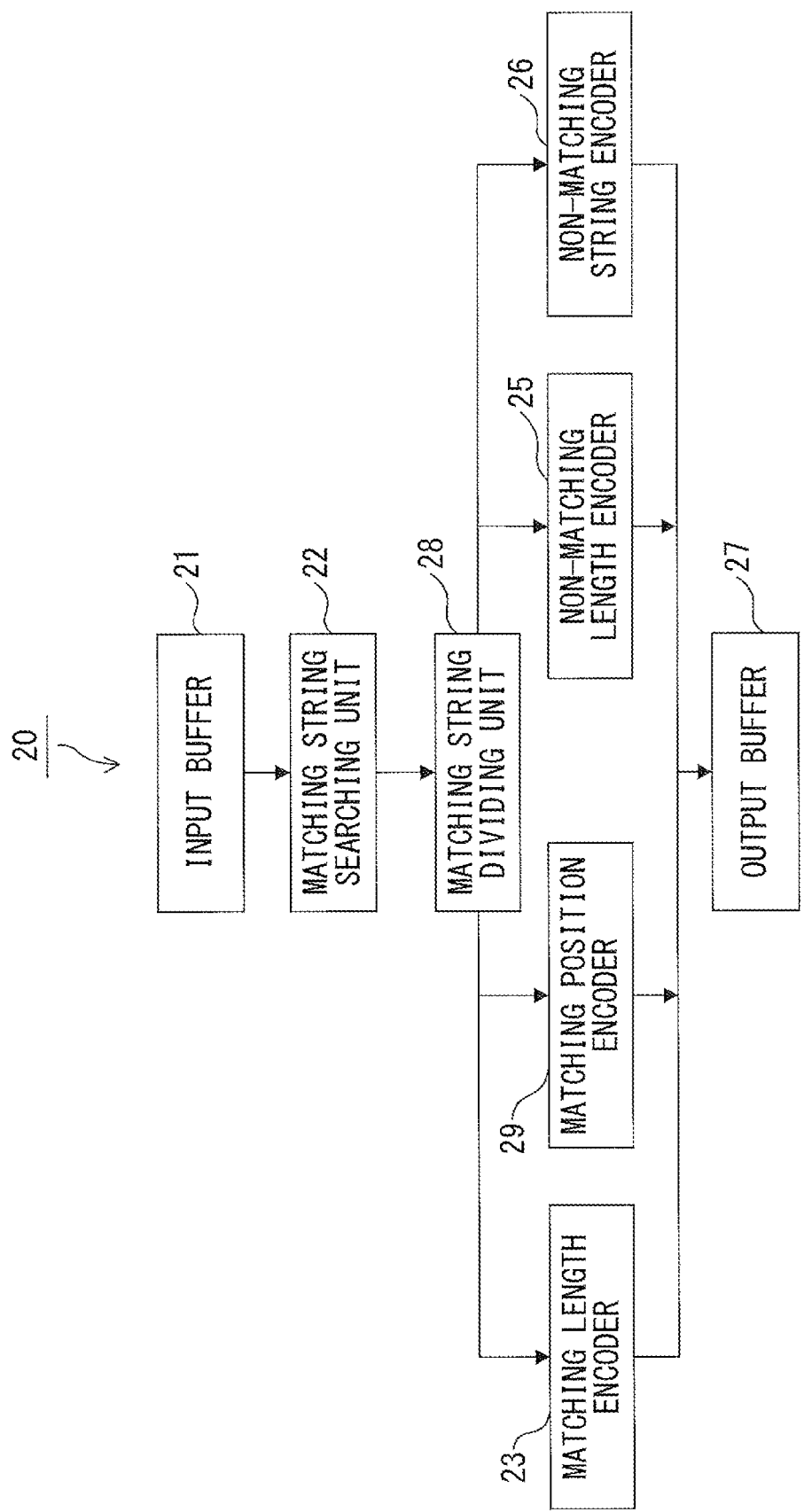
FIG. 7 is an exemplary functional block diagram of a data compression apparatus according to the embodiments.

FIG. 7 is an exemplary functional block diagram of a compression apparatus that compresses original data so as to generate compressed data.

A compression apparatus 20 includes an input buffer 21, a matching string searching unit 22, a matching length encoder 23, a matching position encoder 24, a non-matching length encoder 25, a non-matching string encoder 26, an output buffer 27, and a matching string dividing unit 28. The compression apparatus 20 is different from the compression apparatus 10 in the comparative example in that the matching string dividing unit 28 is included.

The input buffer 21 receives, for example, data before compression (original data) from outside, and temporarily stores the original data, as needed.

The matching string searching unit 22 searches whether a repeatedly appearing character string (a matching string) is included in a character string of original data stored in the input buffer 11, and extracts a matching string. When a matching string is included, the matching string searching unit 22 identifies the matching string. In the example illustrated in FIG. 1, for example, the character strings "compress" and "compression" appear a plurality of times, and therefore these character strings are matching strings.

As described above, the matching string searching unit 22 extracts, as a matching string, a second character string identical with the first character string from a character string after the first character string in a character string of data before compression, and identifies the length of the matching string, and a relative position indicating how many addresses the first character string precedes the second character string by.

Then, the matching string dividing unit 28 divides the matching string in such a way that the relative position is greater than or equal to the matching length, namely, offset≥length.

As described above, the matching string dividing unit 28 extracts a third character string that has a length less than the relative position from the second character string extracted by the matching string searching unit.

Assume as an example that original data is "aaaaaaaaaab". In this example, the character "a" is stored at each of the 1st to 10th addresses, and the character "b" is stored at the 11th address.

Figure 14:
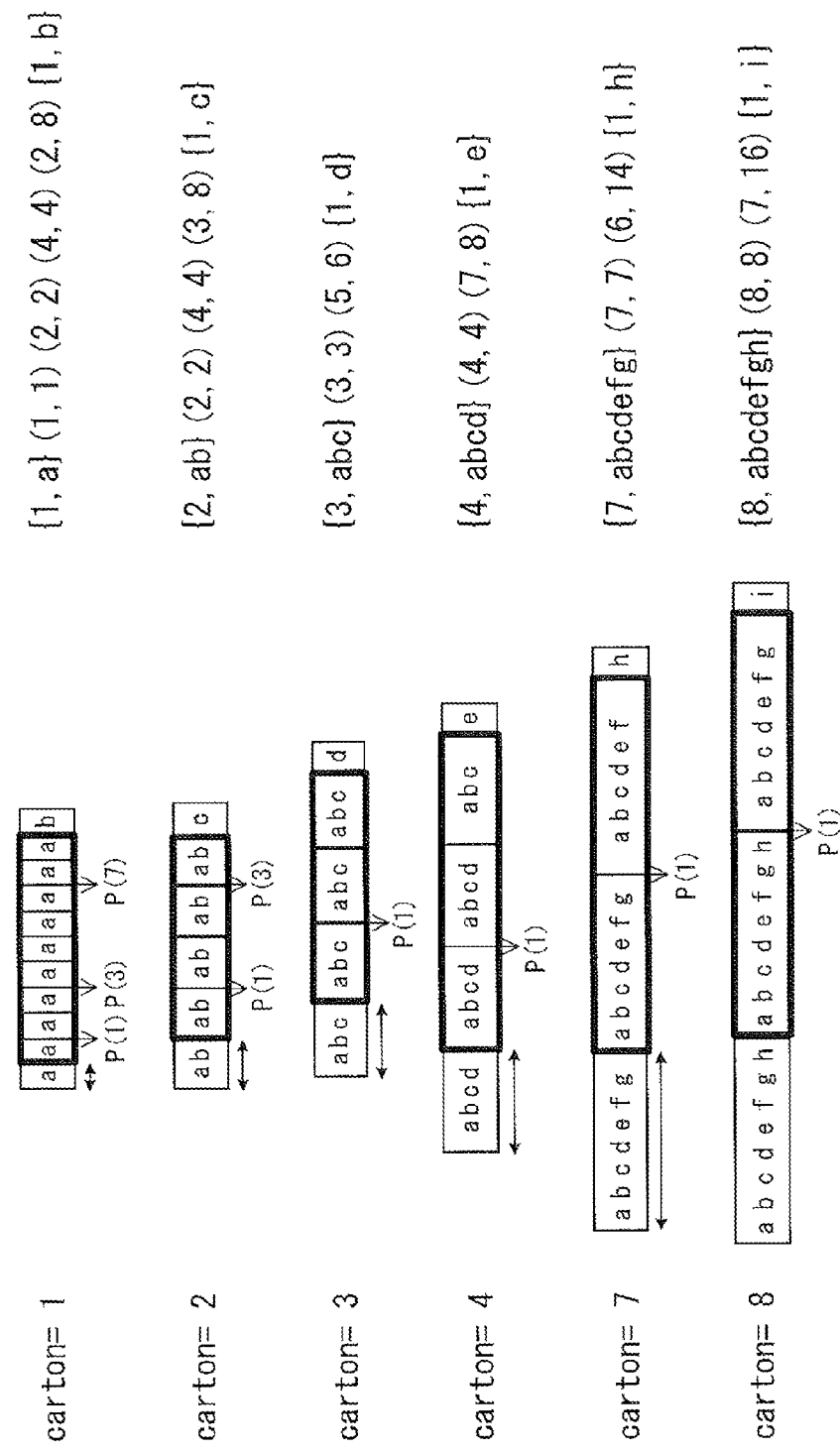
FIG. 14 illustrates an example of division at $P(1)$, $P(3), \ldots,$ and $P(2^m-1)$.

As an example, the character string "aaaaaaaaa" (nine "a"s) at the 2nd to 10th addresses of the character string "aaaaaaaaaab" of original data can be divided into "a"+"aa"+"aaaa"+"aa", as illustrated in FIG. 14. In other words, the character string "aaaaaaaaa" is divided at positions P(1), P(3), and P(7), namely, P($2^m-1$), in FIG. 4. As a result of this, the matching string "a" at the 2nd address of the original data "aaaaaaaaaab" has a matching length (length) of 1 and a relative position (offset) of 1, and therefore offset length is established. The matching string "aa" at the 3rd to 4th addresses has a matching length (length) of 2 and a relative position (offset) of 2, and therefore offset length is established. The matching string "aaaa" at the 5th to 8th addresses has a matching length (length) of 4 and a relative position (offset) of 4, and therefore offset length is established.

As another example, the character string "aaaaaaaaa" (nine "a"s) at the 2nd to 10th addresses of the character string "aaaaaaaaab" of the original data can be divided into "a"+"a"+"aa"+"aaaaaa", as illustrated in FIG. 14. In other words, the character string "aaaaaaaaa" is divided at positions P(1), P(2), and P(4), namely, P(n÷2), P(n÷4), ..., P(n÷2^m), where n=(matching length+carton−1)÷carton, in FIG. 4. As a result of this, the matching string "a" at the 2nd address of the original data "aaaaaaaaab" has a matching length (length) of 1 and a relative position (offset) of 1, and therefore offset≥length is established. The matching string "a" at the 3rd address has a matching length (length) of 1 and a relative position (offset) of 2, and therefore offset≥length is established. The matching string "aa" at the 4th to 5th addresses has a matching length (length) of 2 and a relative position (offset) of 3, and therefore offset≥length is established. The matching string "aaaaa" at the 6th to 10th addresses has a matching length (length) of 5 and a relative position (offset) of 5, and therefore offset≥length is established.

The matching length encoder 23 and the matching position encoder 24 respectively encode the first element and the second element of (matching length, starting position of matching string) representing each of the matching strings obtained by the matching string dividing unit 28, according to Rule 1.

As an example, when the character string "aaaaaaaaa" (nine "a"s) at the 2nd to 10th addresses of the character string "aaaaaaaaab" of the original data is divided into "a"+"aa"+"aaaa"+"aa", as illustrated in FIG. 14, the matching string is encoded into "(1, 1) (2, 2) (4, 4) (2, 8)".

As another example, when the matching string "aaaaaaaaa" (nine "a"s) at the 2nd to 10th addresses of the character string "aaaaaaaaab" of the original data is divided into "a"+"a"+"aa"+"aaaaaa", as illustrated in FIG. 15, the matching string is encoded into "(1, 1) (1, 2) (2, 3) (5, 5)".

The non-matching length encoder 25 extracts the length of a non-matching string that has not been extracted as a matching string by the matching string searching unit 22, and encodes the first element of {non-matching length, non-matching character string} representing the non-matching string, according to Rule 2.

The non-matching string encoder 26 extracts a non-matching string that has not been extracted as a matching string by the matching string searching unit 22, and encodes the second element of {non-matching length, non-matching character string} representing the non-matching string, according to Rule 2.

The output buffer 27 encodes the original data by using results of the matching length encoder 23, the matching position encoder 24, the non-matching length encoder 25, and the non-matching string encoder 26 so as to generate compressed data as a result of compression, and temporarily stores the compressed data, as needed.

FIG. 18 illustrates an example of a configuration of a data compression apparatus 200 according to the embodiments.

A computer 100 includes a Central Processing Unit (CPU) 102, a Read Only Memory (ROM) 104, and a Random Access Memory (RAM) 106. The computer 100 further includes a hard disk drive 108, an input device 110, a display 112, an interface device 114, and a recording medium driving device 116. These components are connected to each other via a bus line 118, and can communicate various pieces of data under the control of the CPU 102.

The Central Processing Unit (CPU) 102 is a computing device that controls the action of the entirety of the computer 100, and functions as a control processing unit of the computer 100.

The Read Only Memory (ROM) 104 is a read-only semiconductor memory in which a prescribed basic control program has been stored. The CPU 102 can control the actions of the respective components of the computer 100 by reading and executing the basic control program at the time of initiation of the computer 100.

The Random Access Memory (RAM) 106 is anon-transitory writable/readable semiconductor memory that is used for a working storage area as needed when the CPU 102 executes various control programs.

The hard disk drive 108 is a storage in which the various control programs executed by the CPU 102 or various pieces of data are stored. The CPU 102 can perform the various control processes described later by reading and executing a prescribed control program stored in the hard disk drive 108.

The input device 110 is, for example, a mouse device or a keyboard device. When the input device 110 is operated by a user of an information processing device, the input device 110 obtains the input of various pieces of information associated with the content of the operation, and transmits the obtained input information to the CPU 102.

The display 512 is, for example, a liquid crystal display, and displays various texts or images according to display data transmitted from the CPU 102.

The interface device 114 manages communication of various pieces of information between various devices connected to the computer 100.

The recording medium driving device 116 is a device that reads various control programs or data recorded in a removable recording medium 120. The CPU 102 can be configured to perform the various control processes described later by reading and executing a prescribed control program recorded in the removable recording medium 120 via the recording medium driving device 116. Examples of the removable recording medium 120 include a flash memory equipped with a connector of the USB (Universal Serial Bus) standard, a CD-ROM (Compact Disc Read Only Memory), and a DVD-ROM (Digital Versatile Disc Read Only Memory).

In order to configure an information processing device by using the computer 100 having the configuration above, a control program for causing the CPU 102 to perform the processes of the above respective processing units is generated, for example. The generated control program has been stored in the hard disk drive 108 or the removable recording medium 120. The CPU 102 is given a prescribed instruction so as to read and execute the control program. By doing this, functions that the information processing device has are provided by the CPU 102.

FIG. 8 illustrates an example of a flow of a compression process performed by the data compression apparatus 20 according to the embodiments.

In a case in which the data compression apparatus 20 is a general-purpose computer 100 as illustrated in FIG. 18, the description below defines a control program for performing the process described below. In other words, the description below is also the description of a control program for causing a general-purpose computer to perform the process described below.

When processing is initiated, the matching string searching unit 22 searches whether a matching string that is a repeatedly appearing character string is included in a character string of original data in S300. When the process of this step is finished, the process moves on to S302. The character string of the original data may be a character string stored in the input buffer 21.

In S302, the matching string searching unit 22 determines whether a matching string has been detected. When the determination result is "YES", namely, when a matching string has been detected, the process moves on to S304. When the determination result is "NO", namely, when a matching string has not been detected, the process moves on to S306.

In S304, the non-matching length encoder 25 and the non-matching string encoder 26 respectively extract the length and the character string of a non-matching string in which the matching string has not been detected. Then, information relating to the length of the non-matching string and information relating to the character string of the non-matching string is temporarily stored in the non-matching length encoder 25 and the non-matching string encoder 26, respectively. These items of information are used in S106. When the process of this step is finished, the process returns to S100.

When a matching string has not been detected in S302, the process moves on to S306.

In S306, the matching string dividing unit 28 detects the length of the matching string, namely, a matching length, and the number of addresses by which a character string identical with the matching string precedes the matching string, namely, a relative position. In S306, the matching string dividing unit 28 divides the matching string in such a way that the relative position is greater than or equal to the matching length, namely, relative position (offset) matching length (length).

When the relative position is greater than or equal to the matching length, namely, relative position (offset) matching length (length) is established, the process of this step is not performed.

In S308, the matching string dividing unit 28 determines whether a character string located immediately before the address of the first character of the divided matching string is a non-matching string. When the determination result is "YES", namely, when the immediately preceding character string is a non-matching string, the process moves on to S310. When the determination result is "NO", namely, when the immediately preceding character string is not a non-matching string, the process moves on to S312.

In S310, the non-matching length encoder 25 and the non-matching string encoder 26 encode the non-matching string immediately before the matching string divided as needed in S306. When the process of this step is finished, the process moves on to S312.

In S312, the matching length encoder 23 and the matching position encoder 24 encode the matching string divided as needed in S306. When the process of this step is finished, the process moves on to S314.

In S314, the output buffer 27 determines whether all portions of original data to be compressed have been processed. When the determination result is "YES", namely, when all portions of original data have been processed, the compression process is terminated. When the determination result is "NO", namely, when not all portions of original data have been processed, the process returns to S300.

A process of decompressing data compressed as a result of a process as illustrated in FIG. 8 is now described with reference to FIG. 9.

Figure 9:
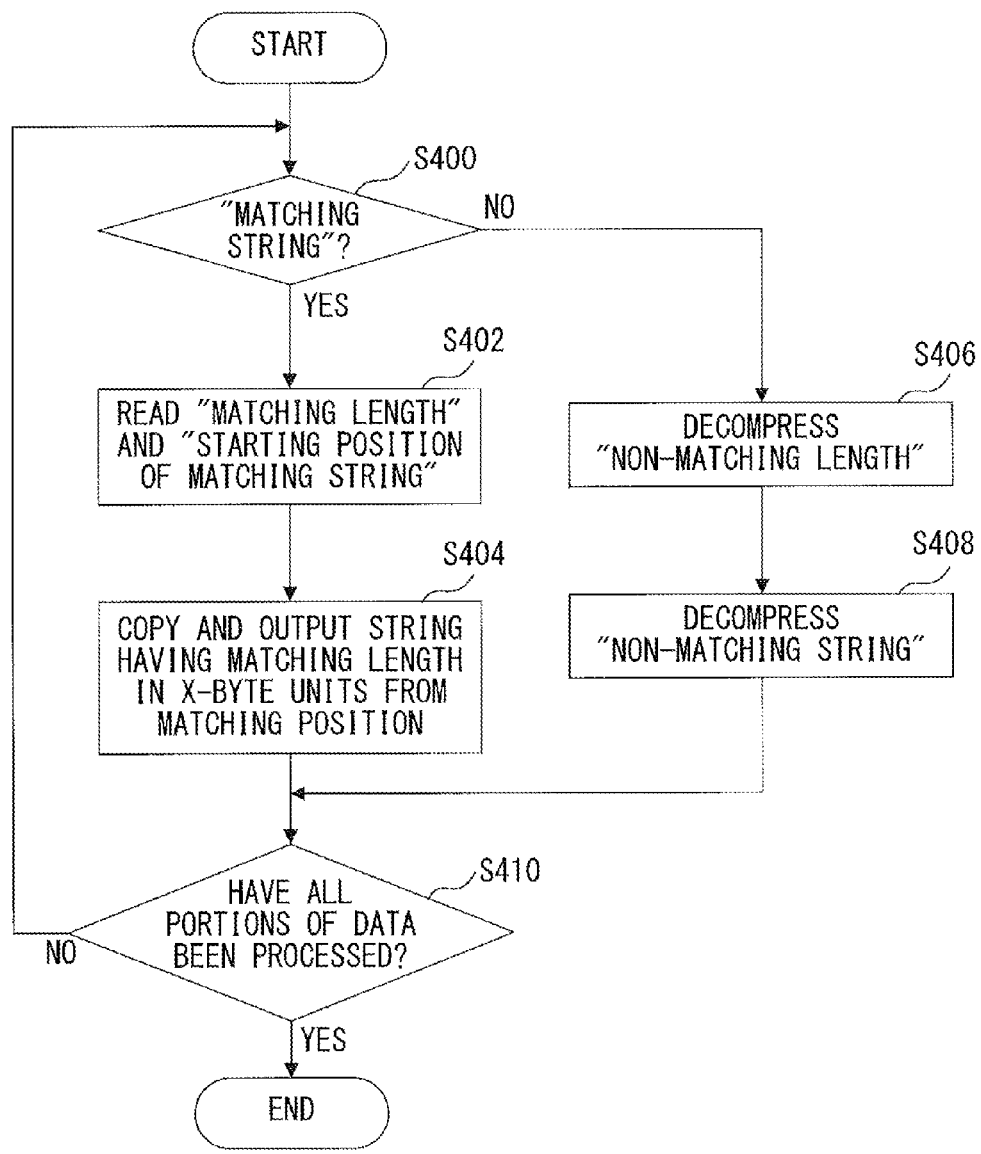
FIG. 9 illustrates an example of a flow of a decompression process according to the embodiments.

The process illustrated in FIG. 9 may be performed, for example, by a computer having the configuration illustrated in FIG. 15.

Assume that compressed data has been stored in the RAM 106 before processing is initiated.

When processing is initiated, the CPU 102 determines whether data being currently processed is a matching string in S400. When the determination result is "YES", namely, when the data being currently processed is a matching string, the process moves on to S402. When the determination result is "NO", namely, when the data being currently processed is not a matching string, the process moves on to S406.

In S402, the CPU 102 reads a matching length and a starting position of the matching string from compressed data of the matching string according to Rule 1. When the process of this step is finished, the process moves on to S404.

In S404, the CPU 102 copies a character string having the matching length from the starting position of the matching string. When the process of this step is finished, the process moves on to S410.

When it is determined in S400 that the data being currently processed is not a matching string, the process moves on to S406.

In S406, the CPU 102 reads and decompresses a non-matching length from compressed data of a non-matching string according to Rule 2. When the process of this step is finished, the process moves on to S408.

In S408, the CPU 102 reads and decompresses a non-matching character string from the compressed data of the non-matching string according to Rule 2.

When the process of this step is finished, the process moves on to S410.

In S410, the CPU 102 determines whether all portions of original data to be decompressed have been processed. When the determination result is "YES", namely, when all portions of compressed data have been processed, the decompression process is terminated. When the determination result is "NO", namely, when not all portions of compressed data have been processed, the process returns to S400.

As described above, the process of decompressing data compressed as a result of the process as illustrated in FIG. 1s simplified, compared with the decompression process illustrated in FIG. 4, and this allows a high-speed process.

EXAMPLES

Overlapping of a copy source and a copy destination occurs in a recurring character string in which one of one character, a two-character string, a three-character string, or the like is repeated. Assume that, in the LZ77 algorithm, a matching string is searched for, and a relative position (offset) and a matching length (length) are obtained. When offset<length is established, the copy source overlaps the copy destination, and therefore the matching string is divided and encoded. Division does not always need to be performed when offset<length is established; a minimum distance of an overlapping portion may be specified in advance as X, and division may be performed only when offset<X is established.

Several methods of division are considered. The following cases are described below.

(Ex1) Perform division at $P(1), P(3), P(7), \ldots, P(2^m-1)$ (where $(2^m-1)<n$).

(Ex2) Perform division at $(P(n \div 2), P(n \div 4), P(n \div 8), \ldots, P(n \div 2^m))$ (where $n \div 2^m > 1$), where n=matching length+carton−1)÷carton.

(Ex3) Specify a minimum distance X of an overlapping portion and a minimum value N of a matching length, and perform division at $P(1), P(1+2), P(1+2+4), \ldots, P(2^m-1)$ (where $(2^m-1)<n$).

(Ex4) Set a minimum value of a matching length as N, perform adjustment in such a way that one set of recurrence is greater than or equal to N, and perform the above divisions (Ex1) to (Ex3).

(Ex1) to (Ex3) described above are described below.

Figure 10A:
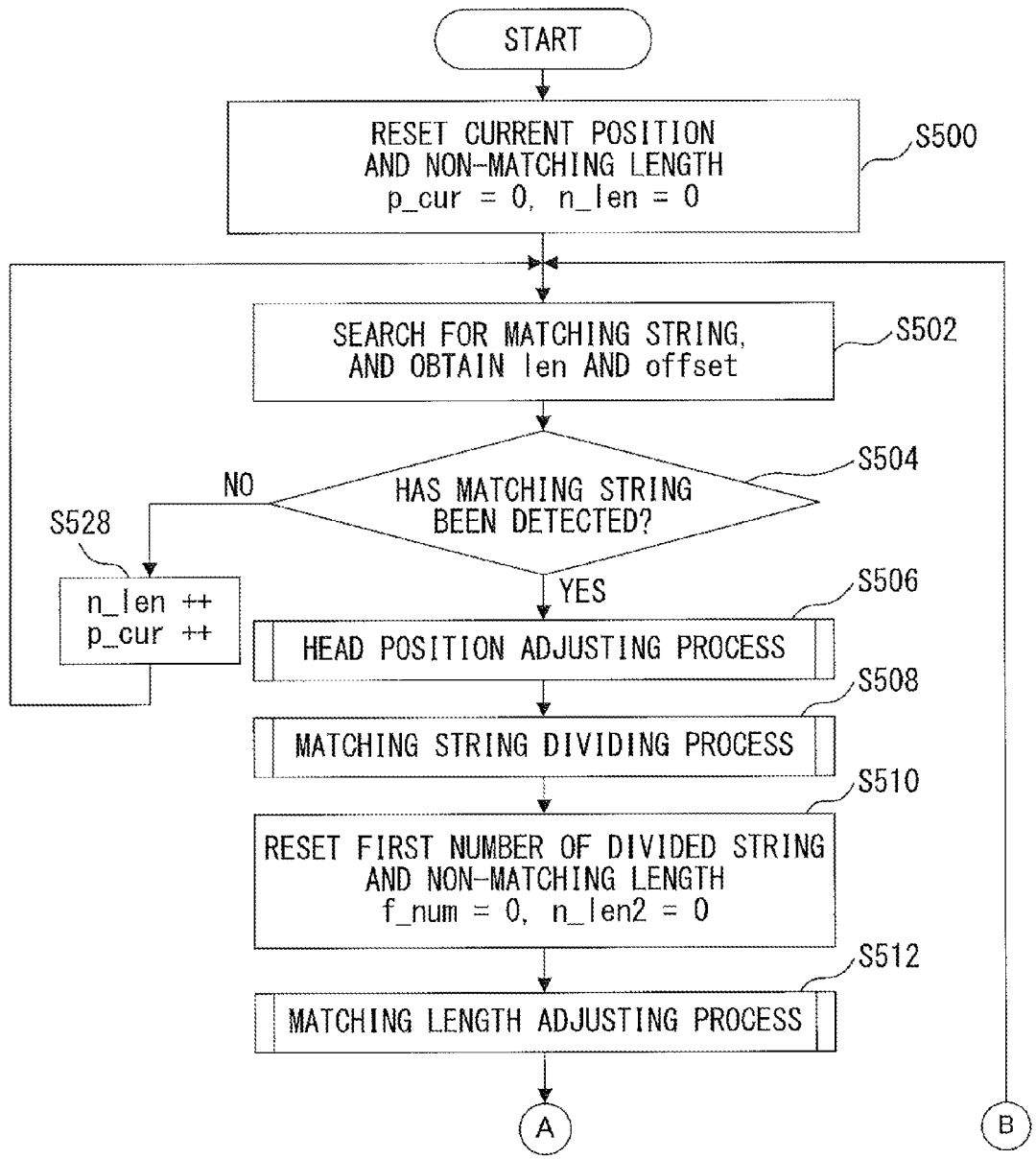
FIGS. 10A through 10C illustrate an example of a flow of a compression process performed by a data compression_ device in examples.
Figure 10B:
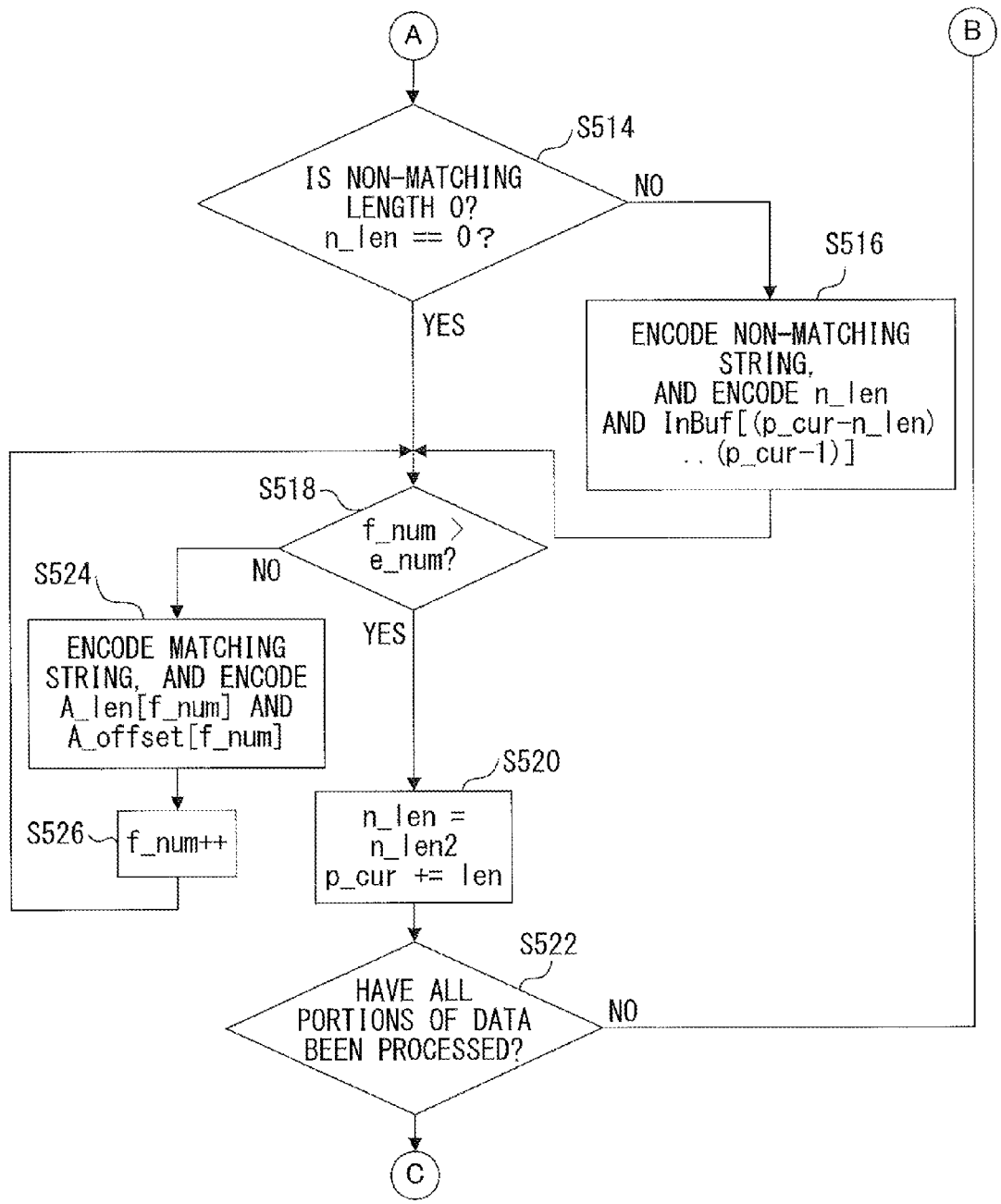
Figure 10C:
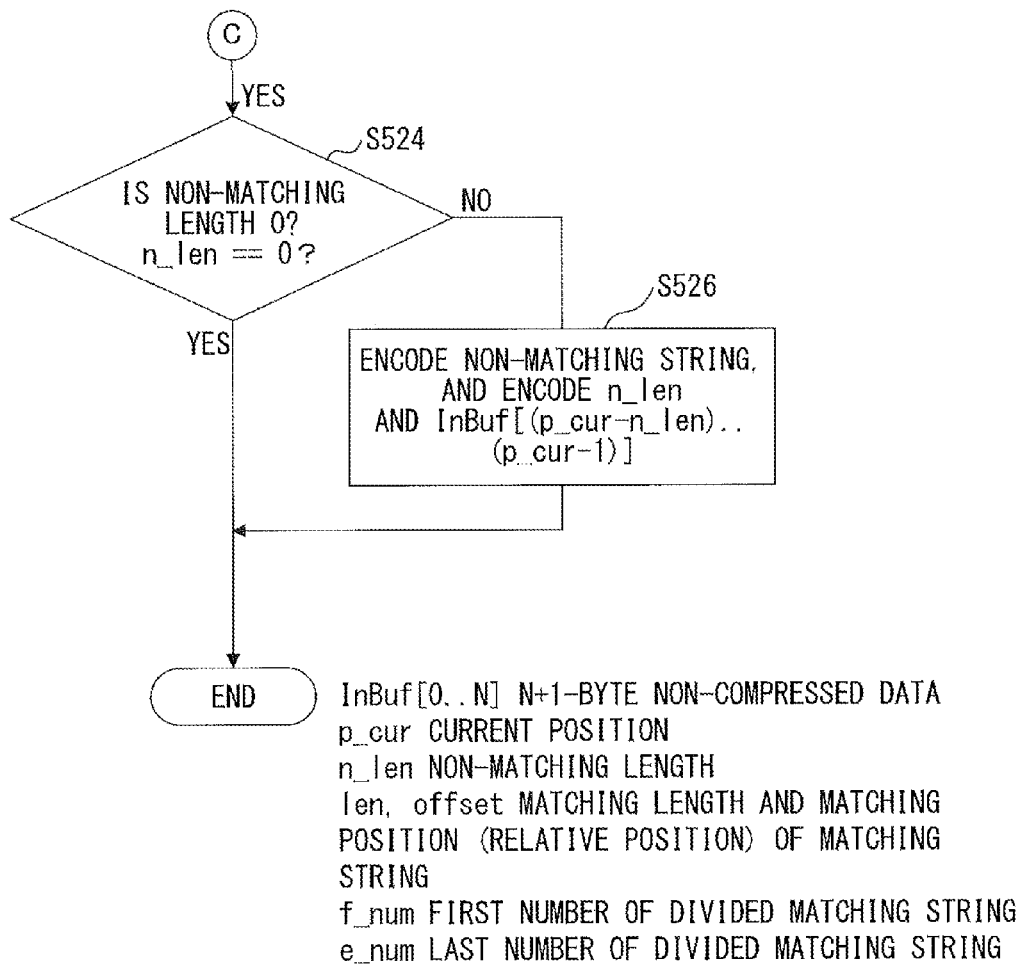

FIGS. 10A through 10C illustrate an example of a flow of a compression process performed by a data compression apparatus in examples.

In a case in which the data compression apparatus 20 is a general-purpose computer 100 as illustrated in FIG. 15, the description below defines a control program for performing the process described below. In other words, the description below is also the description of a control program for causing a general-purpose computer to perform the process described below.

When processing is initiated, the input buffer 21 resets a current address position p_cur and a non-matching length n_len in S500. Assume for example that p_cur=0, and n_len=0. When the process of this step is finished, the process moves on to S502.

In S502, the matching string searching unit 22 searches for a matching string. Specifically, a matching length (len) and a relative position (offset) are obtained. When the process of this step is finished, the process moves on to S504.

In S504, the matching string searching unit 22 determines whether a matching string has been detected. When the determination result is "YES", namely, when a matching string has been detected, the process moves on to S506. When the determination result is "NO", namely, when a matching string has not been detected, the process moves on to S532.

In S506, the matching string searching unit 22 updates the current address position p_cur and the non-matching length n_len. As an example, the current address position p_cur and the non-matching length n_len are respectively incremented by 1.

In S506, a head position adjusting process is performed.

Figure 11:
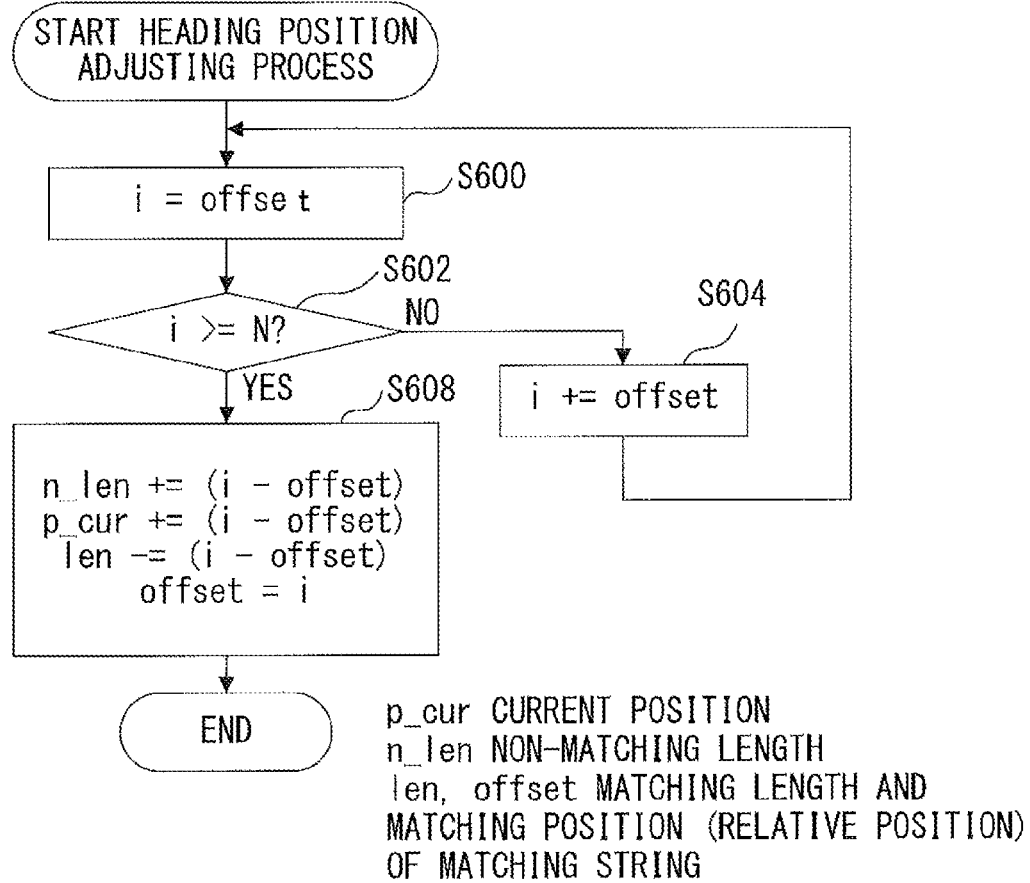
FIG. 11 illustrates an example of a flow of a head position adjusting process in examples.

The head position adjusting process is described with reference to FIG. 11. Assume that a minimum value N of a matching length has been specified in this process.

When processing is initiated, the matching string searching unit 22 substitutes the relative position (offset) for a variable i in S600. When the process of this step is finished, the process moves on to S602.

In S602, the matching string searching unit 22 determines whether the variable i is greater than or equal to the minimum value N of the matching length. When the determination result is "YES", namely, when the variable i is greater than or equal to the minimum value N of the matching length, the process moves on to S606. When the determination result is "NO", namely, when the variable i is not greater than or equal to the minimum value N of the matching length, the process moves on to S604.

In S606, the matching string searching unit 22 adds a value of (i—offset) to the non-matching length n_len, and also adds a value of (i—offset) to the current address position p_cur. Further, the matching string searching unit 22 subtracts the value of (i—offset) from the matching length len of the matching string. When the process of this step is finished, the head position adjusting process is terminated.

In S604, the matching string searching unit 22 adds a value of offset to the variable i.

Returning now to FIG. 10A, in S508 that follows S506, the matching string dividing unit 28 performs a matching string dividing process.

The matching string dividing process is described with reference to FIGS. 12A and 12B.

Figure 12A:
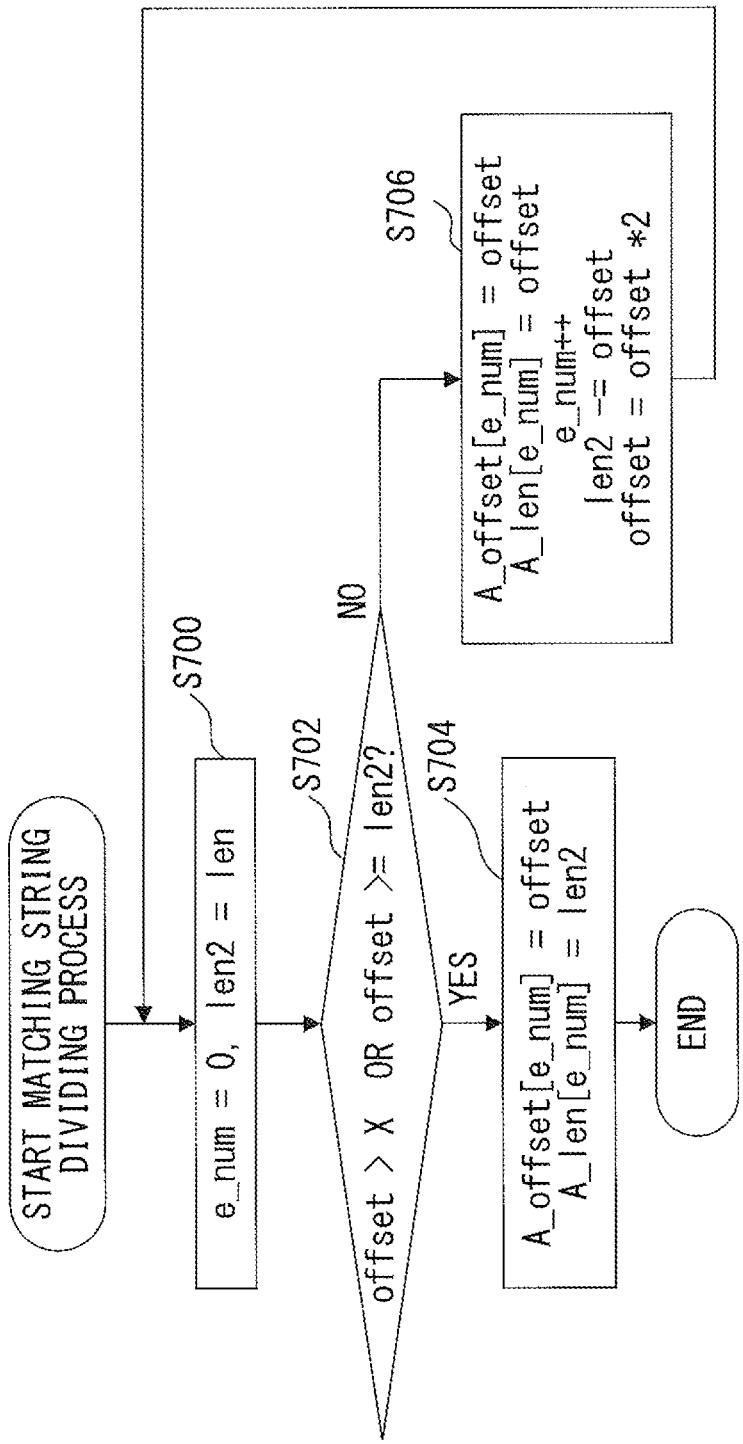
FIG. 12A illustrates an example of a flow of a matching string dividing process in examples.

FIG. 12A illustrates a process in a case in which division is performed at $P(1), P(3), P(7), \ldots, P(2^m-1)$ (where $(2^m-1)<n$), as in Ex1 described above.

When processing is initiated, the matching string dividing unit 28 resets a value of the last number e_num of a divided matching string, and substitutes a value of the matching length len of the matching string for a variable len2 of the matching length of the matching string in S700. When the process of this step is finished, the process moves on to S702.

In S702, the matching string dividing unit 28 determines whether offset>X or offset>len2 is established. When the determination result is "YES", namely, when offset>X or offset>len2 is established, the process moves on to S704. When the determination result is "NO", namely, when offset≤X and offset≤len2 are established, the process moves on to S706.

In S704, the matching string dividing unit 28 substitutes a value of offset for A_offset[e_num], which is a matching position of the divided matching string, and also substitutes a value of len2 for A_len[e_num], which is a matching length of the divided matching string. When the process of this step is finished, the process moves on to S706.

In S706, the matching string dividing unit 28 substitutes the value of offset for A_offset[e_num], which is the matching position of the divided matching string, and also substitutes the value of len2 for A_len[e_num], which is the matching length of the divided matching string. The matching string dividing unit 28 further updates the value of e_num. As an example, the value of e_num is incremented by 1. The value of offset is subtracted from the value of len2, and the value of offset is updated. The value of offset is updated, for example, by doubling the value. When the process of this step is finished, the process returns to S702.

Figure 12B:
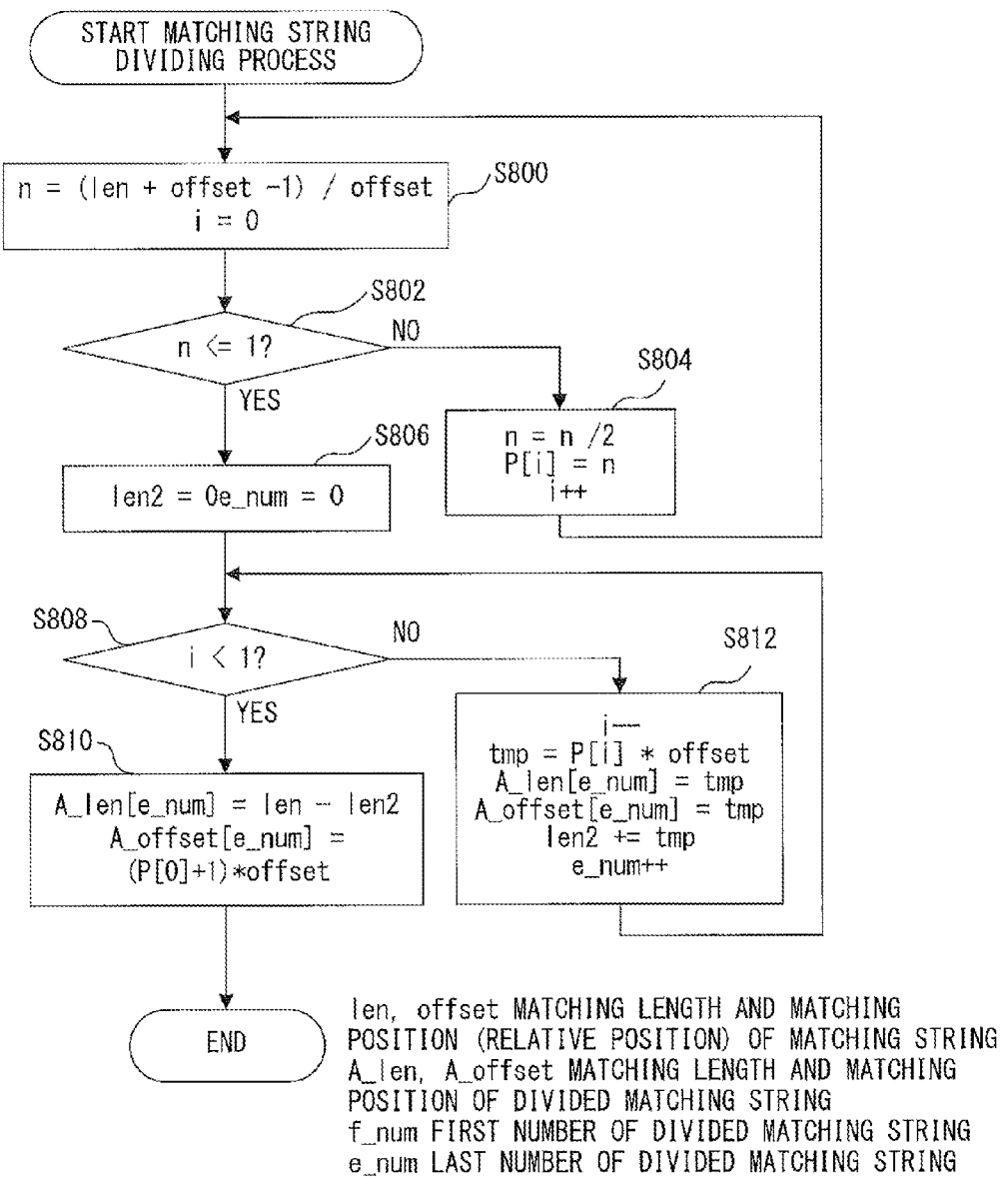
FIG. 12B illustrates another example of a flow of a matching string dividing process in examples.

FIG. 12B illustrates a process in a case in which division is performed at $P(n \div 2), P(n \div 4), P(n \div 8), \ldots, P(n \div 2^m)$ (where $n \div 2^m > 1$), where n=(matching length+carton−1)= relative position, as in Ex2 described above.

When processing is initiated, the matching string dividing unit 28 calculates n=(len+carton−1)÷offset, where len represents a matching length, and offset represents a relative position, in S800. The matching string dividing unit 28 further resets a dummy variable i, and sets i to 0. When the process of this step is finished, the process moves on to S802.

In S804, the matching string dividing unit 28 updates a value of n. As an example, the value is halved. Further, the value of n is substituted for a division position P(i), and a value of the dummy variable i is incremented by 1. When the process of this step is finished, the process returns to S802.

In S806, the matching string dividing unit 28 resets the variable len2 of the matching length of the matching string, and the value of e_num, which is the last number of the divided matching string. Namely, len2 is set to 0, and e_num is set to 0. When the process of this step is finished, the process moves on to S808.

In S808, the matching string dividing unit 28 determines whether the value of the dummy variable i is less than 1. When the determination result is "YES", namely, when the value of the dummy variable i is less than 1, the process moves on to S810. When the determination result is "NO", namely, when the value of the dummy variable i is greater than or equal to 1, the process moves on to S812.

In S810, the matching string dividing unit 28 substitutes a value of (len−len2) for A_len[e_num], which is the matching length of the divided matching string. The matching string dividing unit 28 also substitutes a value of (P(0)+1)×offset for A_offset [e_num], which is the matching position of the divided matching string. When the process of this step is finished, the matching string dividing process is terminated.

In S812, the matching string dividing unit 28 decrements the value of the dummy variable i by 1. Further, the matching string dividing unit 28 substitutes P(i)×offset, which is the product of the division position P(i) and the relative position offset, for a dummy variable tmp, and also substitutes the dummy variable tmp for A_len[e_num], which is the matching length of the divided matching string, and A_offset[e_num], which is the matching position of the divided matching string. The matching string dividing unit 28 adds the value of tmp to the value of len2, and increments the value of e_num by 1. When the process of this step is finished, the process returns to S808.

Returning now to FIG. 10A, in S510, the matching string dividing unit 28 resets f_num, which is the first number of the divided matching string, and n_len2, which is a non-matching length of the divided matching string. Stated another way, f_num is set to 0, and n_len2 is set to 0. When the process of this step is finished, the process moves on to S512.

In S512, the matching string dividing unit 28 performs a matching length adjusting process.

Figure 13:
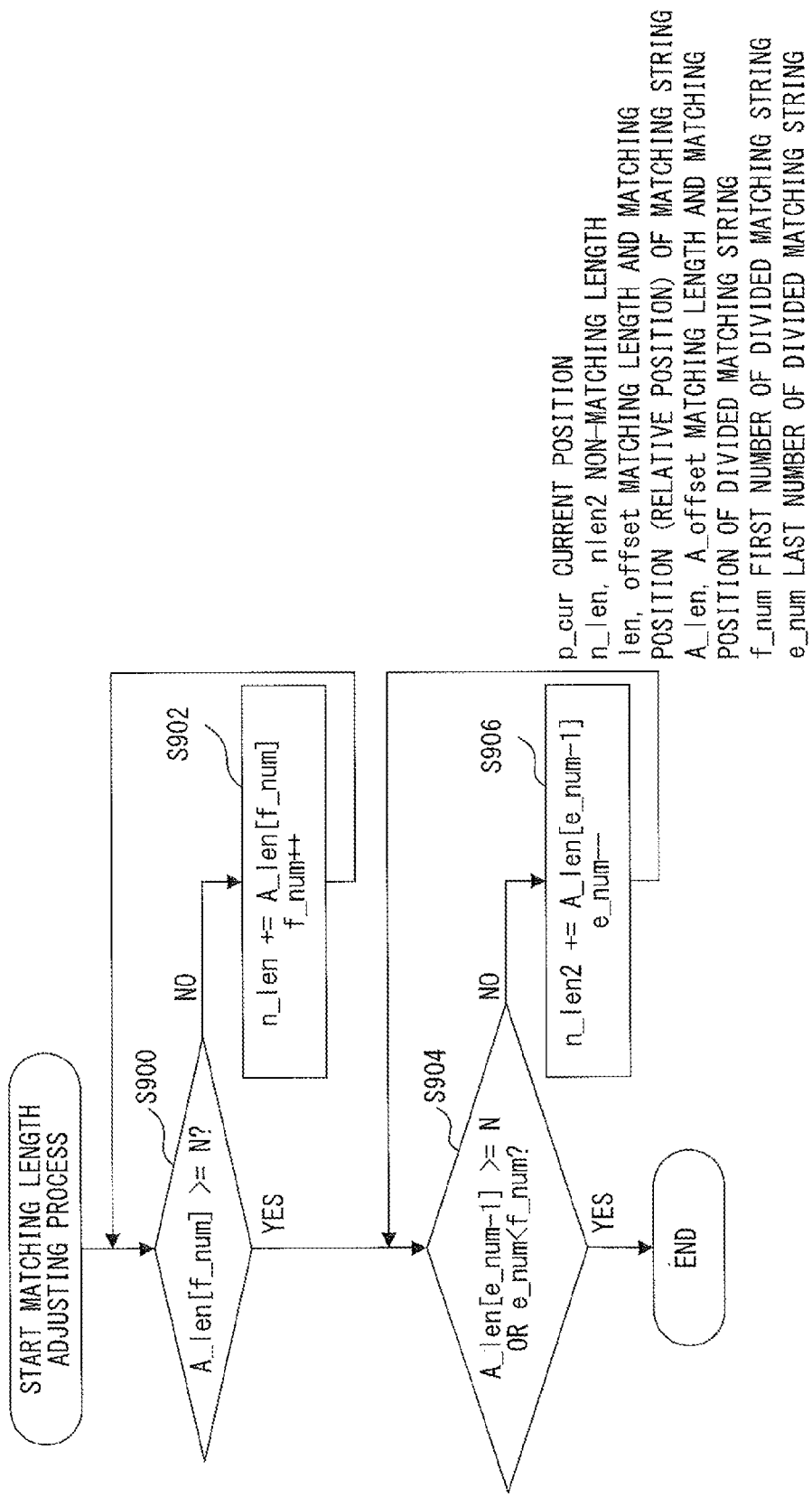
FIG. 13 illustrates an example of a flow of a matching length adjusting process in examples.

The matching length adjusting process is described with reference to FIG. 13.

When processing is initiated, the matching string dividing unit 28 determines in S900 whether A_offset[f_num], which is the matching position of the divided matching string, is greater than or equal to a minimum value N of the matching length. When the determination result is "YES", namely, when A_offset [f_num], which is the matching position of the divided matching string, is greater than or equal to the minimum value N of the matching length, the process moves on to S904. When the determination result is "NO", namely, when A_offset [f_num], which is the matching position of the divided matching string, is less than the minimum value N of the matching length, the process moves on to S902.

In S902, the matching string dividing unit 28 adds a value of A_offset[f_num] to a value of n_len, which is a non-matching length of the divided matching string. Further, the matching string dividing unit 28 increments the value of f_num by 1. When the process of this step is finished, the process returns to S900.

The first divided string is adjusted in the processes of S900 and S902.

In S904, the matching string dividing unit 28 determines whether A_len[e_num−1], which is the matching length of the divided matching string, is greater than or equal to the minimum value N of the matching length, or whether the value of e_num is less than the value of f_num. When the determination result is "YES", namely, when A_len[e_num−1], which is the matching length of the divided matching string, is greater than or equal to the minimum value N of the matching length, or the value of e_num is less than the value of f_num, the matching length adjusting process is finished. When the determination result is "NO", namely, when A_offset[e_num−1], which is the matching position of the divided matching string, is less than the minimum value N of the matching length, and the value of e_num is greater than or equal to the value of f_num, the process moves on to S906.

In S906, the matching string dividing unit 28 adds a value of A_len[e_num−1], which is the matching length of the divided matching string, to a value of n_len2, which is the non-matching length of the divided matching string, and decrements the value of e_num by 1.

Returning now to FIG. 10B, in S514, the matching string dividing unit 28 determines whether the non-matching length n_len is 0. When the determination result is "YES", namely, when the non-matching length n_len is 0, the process moves on to S518. When the determination result is "NO", namely, when the non-matching length n_len is not 0, the process moves on to S516.

In S516, the non-matching length encoder 25 and the non-matching string encoder 26 encode a non-matching string. Namely, a non-matching length n_len and non-compressed data InBuf[(p_cur−n_len), . . . , (p_cur−1)] are encoded. When the process of this step is finished, the process moves on to S518.

In S518, the matching string dividing unit 28 determines whether f_num, which is the first address number of the divided matching string, is greater than e_num, which is the last address number of the divided matching string. When the determination result is "YES", namely, when f_num>e_num is established, the process moves on to S520. When the determination result is "NO", namely, when f_num≤e_num is established, the process moves on to S524.

In S524, the matching length encoder 23 and the matching position encoder 24 encode a matching string. Stated another way, A_len[f_num], which is a matching length of a matching string, and A_offset[f_num] are encoded. When the process of this step is finished, the process moves on to S526.

In S526, the matching length encoder 23 and the matching position encoder 24 increment a value of f_num, which is the first address number of the divided matching string, by 1. When the process of this step is finished, the process returns to S518.

In S520, the matching string dividing unit 28 substitutes a value of n_len2, which is the non-matching length of the divided matching string, for the non-matching length n_len, and adds a value of the matching length len to the current position p_cur. When the process of this step is finished, the process moves on to S522.

In S522, the output buffer 27 determines whether all portions of original data to be compressed have been processed. When the determination result is "YES", namely, when all portions of original data have been processed, the process moves on to S524. When the determination result is "NO", namely, when not all portions of original data have been processed, the process returns to S502.

In S524, the matching string dividing unit 28 determines whether the non-matching length n_len is 0. When the determination result is "YES", namely, when the non-matching length n_len is 0, the process is finished. When the determination result is "NO", namely, when the non-matching length n_len is not 0, the process moves on to S526.

In S526, the non-matching length encoder 25 and the non-matching string encoder 26 encode a non-matching string. In other words, the non-matching length n_len and the non-compressed data InBuf[(p_cur−n_len), . . . , (p_cur−1)] are encoded. When the process of this step is finished, the process is finished.

According to the compression apparatus 20 and the above compression method, in the LZ77 algorithm, when offset<length is established, where offset and length respectively represent a relative position and a matching length of a matching string, a copy source overlaps a copy destination, and therefore the matching string is divided and encoded.

Further, a minimum distance of an overlapping portion may be specified in advance as X, and division may be performed only when offset<X is established.

Overlapping of the copy source and the copy destination occurs in a recurring character string in which one of one character, a two-character string, a three-character string, . . . , is repeated. The length of one set of recurrence coincides with a relative position (relative distance) between the copy source and the copy destination. The first set is encoded by using another code, and overlapping occurs in the second set of recurrence and the sets that follow.

Accordingly, the copy source is prevented from overlapping the copy destination by dividing a matching character string at some or all of positions P(1)=carton, P(2)=carton×2, . . . , P(n)=carton×n (where P(n) is less than length), where carton represents the length of one set of recurrence, from the head of the matching character string.

An example in which division is performed at P(1), P(3), P(7), . . . , and P($2^m-1$) (where ($2^m-1$)<n), and an example in which division is performed at P(n÷2), P(n÷4), P(n÷8), . . . , and P(n÷$2^m$)) (where n÷$2^m$>1), where n=(matching length+carton−1)÷carton, are illustrated in FIGS. 14 and 15, respectively. In addition, a minimum value N of the matching length may be specified in advance, and a portion in which the matching length is less than or equal to N as a result of the division of the matching character string may be dealt with as a non-matching string.

FIG. 16 illustrates a case in which a minimum distance X of an overlapping portion and a minimum value N of a matching length are specified, and minimum distance X of overlapping portion=8, and minimum value N of matching length=3 in an example in which division is performed at P(1), P(1+2), P(1+2+4), . . . , P($2^m-1$) (where ($2^m-1$)<n). In this case, a portion in which the matching length is less than or equal to N as a result of the division of a matching character string is dealt with as a non-matching string.

When the minimum value of the matching length is N, one set of recurrence may be adjusted so as to be less than or equal to N, and the above division may be performed. Specifically, when relative position offset<N is established, the head position of a matching string may be moved in a backward direction by a maximum length of offset×i in such a way that N≤offset×i (where i is an integer value).

As an example, FIG. 17 illustrates an example in which, when minimum value N of matching length=3 is established, one set of recurrence is adjusted so as to be less than or equal to N, and division is performed at P(1), P(1+2), P(1+2+4), . . . , and P($2^m-1$) (where ($2^m-1$)<n).

Division whereby a code amount is minimized may be selected from among division at all of the positions P(1), P(2), P(n), and divisions illustrated in FIGS. 14-17.

Example 1 (Ex1)

FIG. 14 illustrates an example of division at P(1), P(3), P(7), . . . , and P($2^m-1$) (where ($2^m-1$)<n).

As an example of a case where carton=1, FIG. 14 illustrates a case where original data is "aaaaaaaaab".

In this case, "a" at the 1st address is a non-matching string, and "aaaaaaaaa" at the 2nd to 10th addresses is a matching string. The character "b" at the 11th address is a non-matching string. The matching string "aaaaaaaaa" at the 2nd to 10th addresses is divided at portions after the first, third, and seventh characters. In other words, the matching string "aaaaaaaaa" is divided into "'a'+'aa'+'aaaa'+remainder".

When original data is "aaaaaaaaab", the obtained compressed data is "{1, a}(1, 1) (2, 2) (4, 4) (2, 8){1, b}".

As an example of a case where carton=2, FIG. 14 illustrates a case where original data is "ababababac". In this case, "ab" at the 1st to 2nd addresses is a non-matching string, and "abababa" at the 3rd to 10th addresses is a matching string. The character "c" at the 11th address is a non-matching string. "abababa" at the 3rd to 9th addresses is divided at portions after the first and third cartons. In other words, the matching string "abababab" is divided into "'ab'+'abab'+remainder".

When original data is "ababababac", the obtained compressed data is "{2, ab}, (2, 2) (4, 4) (3, 8){1, c}".

As an example of a case where carton=3, FIG. 14 illustrates a case where original data is "abcabcabcabd". In this case, "abc" at the 1st to 3rd addresses is a non-matching string, and "abcabcab" at the 4th to 11th addresses is a matching string. The character "d" at the 12th address is a non-matching string. "abcabcab" at the 4th to 11th addresses is divided at a position after the first carton. In other words, the matching string "abcabcabc" is divided into "'abc'+remainder".

When original data is "abcabcabcabd", the obtained compressed data is "{3, abc}(3, 3) (5, 6){1, d}".

As an example of a case where carton=4, FIG. 14 illustrates a case where original data is "abcdabcdabcdabce". In this case, "abcd" at the 1st to 4th addresses is a non-matching string, and "abcdabcdabcd" at the 5th to 15th addresses is a matching string. The character "e" at the 17th address is a non-matching string. "abcdabcdabc" at the 5th to 15th addresses is divided at a position after the first carton. In other words, the matching string "abcdabcdabc" is divided into "'abcd'+remainder".

When original data is "abcdabcdabcdabcde", the obtained compressed data is "{4, abcd}(4, 4) (7, 8){1, e}".

As an example of a case where carton=7, FIG. 14 illustrates a case where original data is "abcdefgabcdefgabcdefh". In this case, "abcdefg" at the 1st to 7th addresses is a non-matching string, and "abcdefgabcdef" at the 8th to 20th addresses is a matching string. The character "h" at the 21th address is a non-matching string. "abcdefgabcdef" at the 8th to 20th addresses is divided at a position after the first carton. In other words, the matching string "abcdefgabcdef" is divided into "'abcdefg'+remainder".

When original data is "abcdefgabcdefgabcdefh", the obtained compressed data is "{7, abcdefg} (7, 7) (6, 14) {1, h}".

As an example of a case where carton=8, FIG. 14 illustrates a case where original data is "abcdefghabcdefghabcdefgi". In this case, "abcdefgh" at the 1st to 8th addresses is a non-matching string, and "abcdefghabcdefg" at the 9th to 24th addresses is a matching string. The character "i" at the 25th address is a non-matching string. "abcdefghabcdefg" at the 9th to 23rd addresses is divided at a position after the first carton. In other words, the matching string "abcdefghabcdefg" is divided into "'abcdefgh'+remainder".

When original data is "abcdefghabcdefghabcdefgi", the obtained compressed data is "{8, abcdefgh} (8, 8) (7, 16) {1, i}".

Example 2 (Ex2)

FIG. 15 illustrates an example in which division is performed at P(n÷2), P(n÷4), P(n÷8), . . . , and P(n÷$2^w$)) (where n÷$2^w$>1), where n=(matching length+carton−1)÷carton.

As an example of a case where carton=1, FIG. 15 illustrates a case where original data is "aaaaaaaaab".

The matching string "aaaaaaaaa" at the 2nd to 10th addresses is divided. In this case, n=(9+1−1)=1=9 is established, and therefore division is performed at P(4), P(2), and P(1). In other words, the matching string "aaaaaaaaa" is divided into "'a'+'a'+'aa'+remainder".

When original data is "aaaaaaaaab", the obtained compressed data is "{1, a}(1, 1) (1, 2) (2, 3) (5, 5){1, b}".

As an example of a case where carton=2, FIG. 15 illustrates a case where original data is "ababababababc". In this case, "ab" at the 1st to 2nd addresses is a non-matching string, and "abababab" at the 3rd to 11th addresses is a matching string. The character "c" at the 12th address is a non-matching string. In this case, n=(9+2−1)+2=5 is established, and therefore division is performed at P(2) and P(1). In other words, the matching string "ababababab" is divided into "'ab'+'ab'+remainder".

When original data is "ababababababc", the obtained compressed data is "{2, ab}, (2, 2) (2, 4) (5, 4){1, c}".

As an example of a case where carton=3, FIG. 15 illustrates a case where original data is "abcabcabcabd". In this case, "abc" at the 1st to 3rd addresses is a non-matching string, and "abcabcab" at the 4th to 11th addresses is a matching string. The character "d" at the 12th address is a non-matching string. In this case, n=(8+3−1)÷3=3 is established, and therefore division is performed at P(1). In other words, the matching string "abcabcab" is divided into "'abc'+remainder".

When original data is "abcabcabcabd", the obtained compressed data is "{3, abc}(3, 3) (5, 6){1, d}".

As an example of a case where carton=4, FIG. 15 illustrates a case where original data is "abcdabcdabcdabce". In this case, "abcd" at the 1st to 4th addresses is a non-matching string, and "abcdabcdabc" at the 5th to 15th addresses is a matching string. The character "e" at the 16th address is a non-matching string. In this case, n=(11+4−1)÷4=3 is established, and therefore division is performed at P(1). In other words, the matching string "abcdabcdabc" is divided into "'abcd'+remainder".

When original data is "abcdabcdabcdabce", the obtained compressed data is "{4, abcd}(4, 4) (7, 8){1, e}".

As an example of a case where carton=7, FIG. 15 illustrates a case where original data is "abcdefgabcdefgabcdefh". In this case, n=(11+7−1)÷7=2 is established, and therefore the matching string "abcdefgabcdef" is divided into "'abcdefg'+remainder".

When original data is "abcdefgabcdefgabcdefh", the obtained compressed data is "{7, abcdefg} (7, 7) (6, 14) {1, h}".

As an example of a case where carton=8, FIG. 15 illustrates a case where original data is "abcdefghabcdefghabcdefgi". In this case, "abcdefgh" at the 1st to 8th addresses is a non-matching string, and "abcdefghabcdefg" at the 9th to 23rd addresses is a matching string. The character "i" at the 24th address is a non-matching string. In this case, n=(15+8−1)÷8=2 is established, and therefore the matching string "abcdefghabcdefgh" is divided into "'abcdefgh'+remainder".

When original data is "abcdefghabcdefghabcdefgi", the obtained compressed data is "{8, abcdefgh} (8, 8) (7, 16) {1, i}".

Example 3 (Ex3)

FIG. 16 illustrates an example in which a minimum distance X of an overlapping portion and a minimum value N of a matching length are specified, and division is performed at P(1), P(1+2), P(1+2+4), . . . , and P($2^m$−1) (where ($2^m$−1)<n). FIG. 16 illustrates a case where minimum distance X of overlapping portion=8, and minimum value N of matching length=3. In this case, a portion in which the matching length is less than or equal to N as a result of the division of a matching character string is dealt with as a non-matching string.

As an example of a case where carton=1, FIG. 16 illustrates a case where original data is "aaaaaaaaab".

In this case, "a" at the 1st address is a non-matching string, and "aaaaaaaaa" at the 2nd to 10th addresses is a matching string. The character "b" at the 11th address is a non-matching string. The matching string "aaaaaaaaa" at the 2nd to 10th addresses is divided at portions after the first, third, and seventh characters. In order to establish minimum value N of matching length=3, the original data "aaaaaaaaab" is divided into "'aaaa'+'aaaa'+'aab'".

As a result, the obtained compressed data is "{4, aaaa}(4, 4){3, aab}".

As an example of a case where carton=2, FIG. 16 illustrates a case where original data is "ababababababc". In this case, "ab" at the 1st to 2nd addresses is a non-matching string, and "abababab" at the 3rd to 10th addresses is a matching string. The character "c" at the 11th address is a non-matching string. "abababab" at the 3rd to 10th addresses is divided at positions after the first and third cartons. In order to establish minimum value N of matching length=3, the original data "ababababababc" is divided into "'abab'+'abab'+'abab'+'c'".

Accordingly, the obtained compressed data is "{4, abab} (4, 4) (4, 8) {1, c}". As an example of a case where carton=3, FIG. 16 illustrates a case where original data is "abcabcabcabcd". In this case, "abc" at the 1st to 3rd addresses is a non-matching string, and "abcabcabc" at the 4th to 12th addresses is a matching string. The character "d" at the 13th address is a non-matching string. "abcabcabc" at the 4th to 12th addresses is divided at a position after the first carton. In order to establish minimum value N of matching length=3, the original data "abcabcabcabcd" is divided into "'abc'+'abc'+'abc'+'d'".

As a result, the obtained compressed data is "{3, abc} (3, 3) (6, 6) {1, d}".

As an example of a case where carton=4, FIG. 16 illustrates a case where original data is "abcdabcdabcdabcde". In this case, "abcd" at the 1st to 4th addresses is a non-matching string, and "abcdabcdabcd" at the 5th to 16th addresses is a matching string. The character "e" at the 17th address is a non-matching string. "abcdabcdabcd" at the 5th to 16th addresses is divided at a position after the first carton. In order to establish minimum value N of matching length=3, the original data "abcdabcdabcdabcde" is divided into "'abcd'+'abcd'+'abcdabcd'+'e'". As a result, the obtained compressed data is "{4, abcd}(4, 4) (8, 8){1, e}".

As an example of a case where carton=7, FIG. 16 illustrates a case where original data is "abcdefgabcdefgabcdefh". In this case, "abcdefg" at the 1st to 7th addresses is a non-matching string, and "abcdefgabcdefg" at the 8th to 21st addresses is a matching string. The character "h" at the 22nd address is a non-matching string. "abcdefgabcdef" at the 8th to 21st addresses is divided at a position after the first carton. In order to establish minimum value N of matching length=3, the original data "abcdefgabcdefgabcdefgh" is divided into "'abcdefg'+'abcdefg'+'abcdef'+'h'".

As a result, the obtained compressed data is "{7, abcdefg} (7, 7) (6, 14) {1, h}".

As an example of a case where carton=8, FIG. 16 illustrates a case where original data is "abcdefghabcdefghabcdefgi". In this case, "abcdefgh" at the 1st to 8th addresses is a non-matching string, and "abcdefghabcdefg" at the 9th to 23rd addresses is a matching string. The character "i" at the 24th address is a non-matching string. In this case, the carton (=8) is greater than or equal to the minimum distance, and therefore division is not performed.

Accordingly, the obtained compressed data is "{8, abcdefgh}(15, 8){1, i}".

Example 4 (Ex4)

FIG. 17 illustrates an example in which the first address is adjusted in such a way that one set of recurrence is greater than or equal to the minimum value N(=3) of the matching length.

In a case where carton=1, the position of the first address of a matching string is adjusted in such a way that carton=3.

The original data "aaaaaaaaaab" is divided into "'aaa'+'aaa'+'aaaa'+'b'".

As a result, the obtained compressed data is "{3, aaa} (3, 3) (4, 6) {1, b}".

In a case where carton=2, the position of the first address of a matching string is adjusted in such a way that carton=4.

When original data is "abababababac", the original data is divided into "'abab'+'abab'+'aba'+'c'".

As a result, the obtained compressed data is "{4, abab} (4, 4) (3, 8) {1, c}".

In a case where carton=3, the carton (=3) is greater than or equal to the minimum value of the matching length, and therefore the head position is not adjusted.

When original data is "abcabcabcabd", the obtained compressed data is "{3, abc}(3, 3) (5, 6){1, d}".

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A data compression apparatus comprising:
a memory; and
a processor that:
extracts a second character string as a matching string from a character string after a first character string in a character string of data before compression that is stored in the memory, the second character string being identical with the first character string, and identifies a length of the matching string, and a relative position indicating how many addresses the first character string precedes the second character string by;
extracts a third character string having a length that is less than the relative position from the extracted second character string;
encodes a length of the third character string; and
encodes the relative position.

2. The data compression apparatus according to claim 1, wherein
when the relative position is less than a prescribed value, the processor extracts the third character string from the second character string.

3. The data compression apparatus according to claim 1, wherein
the processor further performs a process that includes:
extracting, as a non-matching character string, a character string that does not include the second character string identical with the first character string after the first character string in the character string of the data before compression, or a character string that the second character string having a length that is less than a prescribed length; and
extracting, when the length of the third character string is less than a prescribed value, as the non-matching string or a portion of the non-matching string, a maximum value that is a multiple of the length of the third character string, and that does not exceed the prescribed value.

4. The data compression apparatus according to claim 1, wherein
the processor defines, as a carton, a minimum unit of recurrence in a recurring character string included in the matching string, and divides the second character string at some or all of positions that each correspond to an integral multiple of the carton from a head of the second character string.

5. The data compression apparatus according to claim 4, wherein
the processor divides the second character string at some or all of positions that each correspond to $2^m-1$ (where m is an integer) with the carton as a unit from the head of the second character string.

6. The data compression apparatus according to claim 4, wherein
when n=(length+carton−1)÷carton is established, where length represents a matching length, and carton represents a length of the carton, the processor divides the second character string at some or all of positions that each correspond to $n \div 2^m$ (where m is an integer) with the carton as a unit from the second character string.

7. A data compression method performed by a computer, the data compression method comprising:
extracting a second character string as a matching string from a character string after a first character string in a character string of data before compression that is stored in a memory, the second character string being identical with the first character string, and identifying a length of the matching string, and a relative position indicating how many addresses the first character string precedes the second character string by;
extracting a third character string having a length that is less than the relative position from the extracted second character string;
encoding a length of the third character string; and
encoding the relative position.

8. A computer-readable recording medium having stored therein a program for causing a computer to execute a process comprising:
extracting a second character string as a matching string from a character string after a first character string in a character string of data before compression that is stored in a memory, the second character string being identical with the first character string, and identifying a length of the matching string, and a relative position indicating how many addresses the first character string precedes the second character string by;

extracting a third character string having a length that is less than the relative position from the extracted second character string;
detecting and encoding a length of the third character string; and
encoding the relative position.

* * * * *